United States Patent
Ohsawa

(10) Patent No.: US 7,123,509 B2
(45) Date of Patent: Oct. 17, 2006

(54) FLOATING BODY CELL MEMORY AND READING AND WRITING CIRCUIT THEREOF

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 10/756,513

(22) Filed: Jan. 14, 2004

(65) Prior Publication Data

US 2005/0068807 A1    Mar. 31, 2005

(30) Foreign Application Priority Data

Sep. 30, 2003   (JP)   ............... 2003-341533

(51) Int. Cl.
G11C 11/34    (2006.01)
G11C 7/06     (2006.01)
G11C 7/14     (2006.01)
G11C 7/22     (2006.01)
G11C 16/04    (2006.01)
G11C 16/28    (2006.01)

(52) U.S. Cl. ............... 365/184; 365/176; 365/210; 365/185.2; 365/185.21; 365/189.07

(58) Field of Classification Search ............ 365/176, 365/184, 185.01, 185.03, 185.2, 189.06, 365/210, 189.07, 185.21; 257/347, 314
See application file for complete search history.

(56) References Cited

U.S. PATENT DOCUMENTS

| 5,568,419 | A | * | 10/1996 | Atsumi et al. | ........... 365/185.3 |
| 5,754,475 | A | * | 5/1998  | Bill et al.   | ........... 365/185.25 |
| 6,538,916 | B1 |  | 3/2003  | Ohsawa        |  |
| 6,617,651 | B1 |  | 9/2003  | Ohsawa        |  |
| 6,621,725 | B1 |  | 9/2003  | Ohsawa        |  |
| 6,842,378 | B1 | * | 1/2005 | Chang         | ........... 365/185.22 |

FOREIGN PATENT DOCUMENTS

| JP | 2002-246571 | 8/2002 |
| JP | 2003-068877 | 3/2003 |
| WO | WO 2103703 A2 * | 12/2002 |

OTHER PUBLICATIONS

Okhonin et al., IEEE Electron Device Letters, vol. 23, No. 2, Feb. 2002, pp. 85-87.*

* cited by examiner

Primary Examiner—J. H. Hur
(74) Attorney, Agent, or Firm—Finnegan, Henderson, Farabow, Garrett & Dunner, L.L.P.

(57) ABSTRACT

A semiconductor integrated circuit device is provided, which includes a semiconductor layer formed via an embedded insulation film on a substrate and an FBC (Floating Body Cell) which stores data by accumulating a majority carrier in a floating channel body formed on the semiconductor layer.

6 Claims, 20 Drawing Sheets

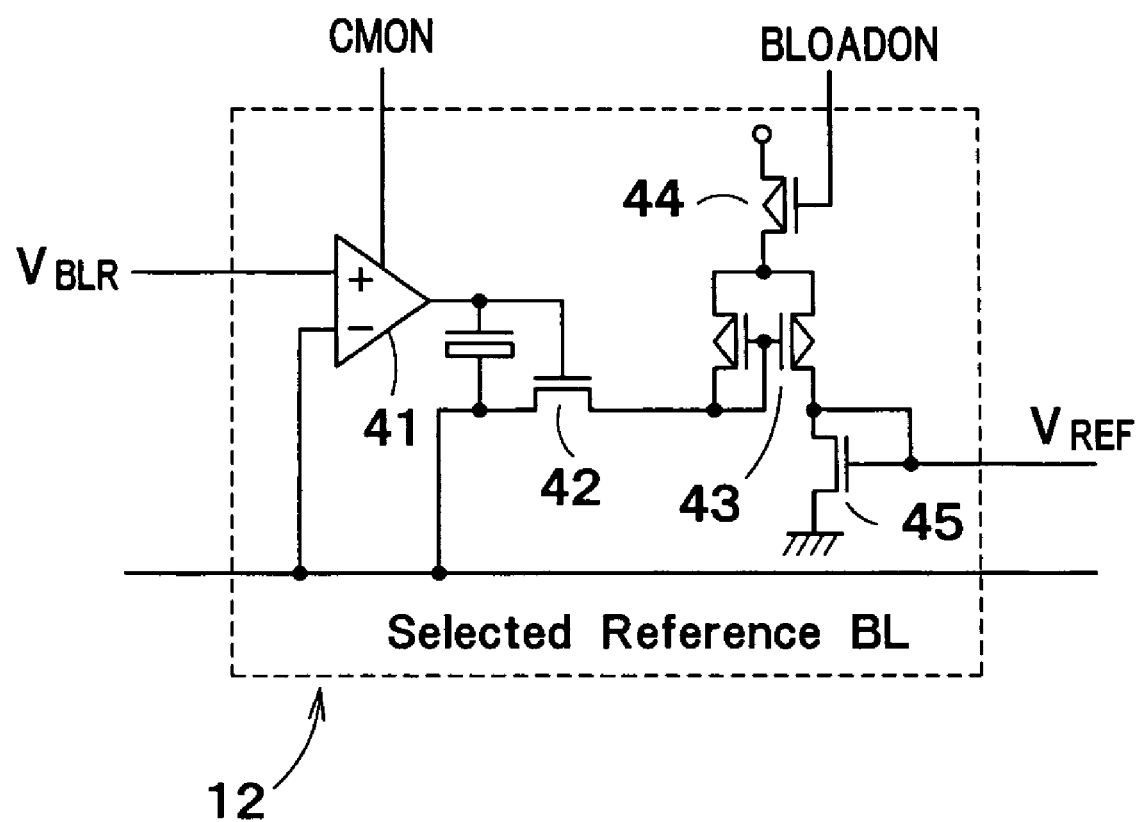
F I G. 10

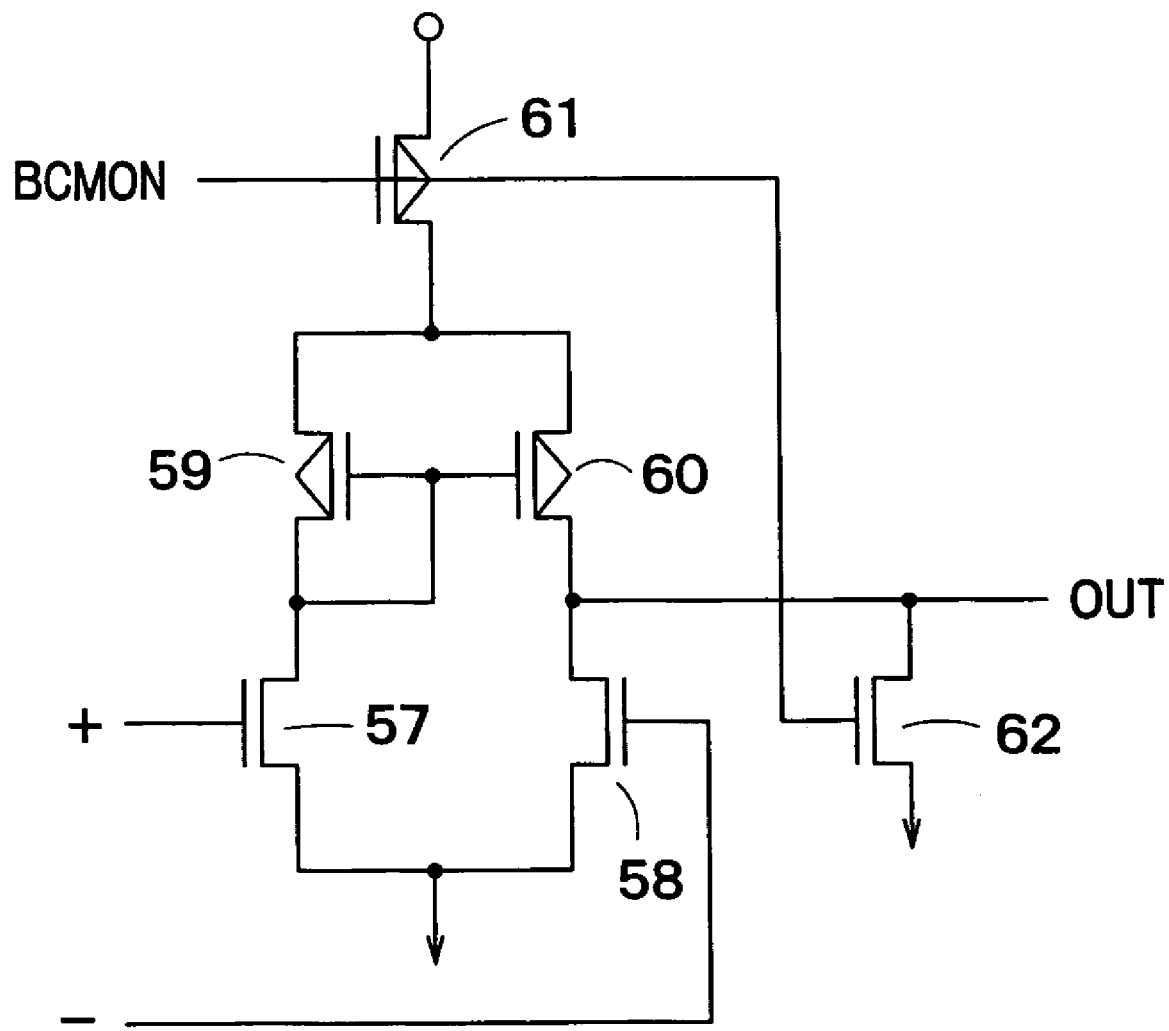
F I G. 12

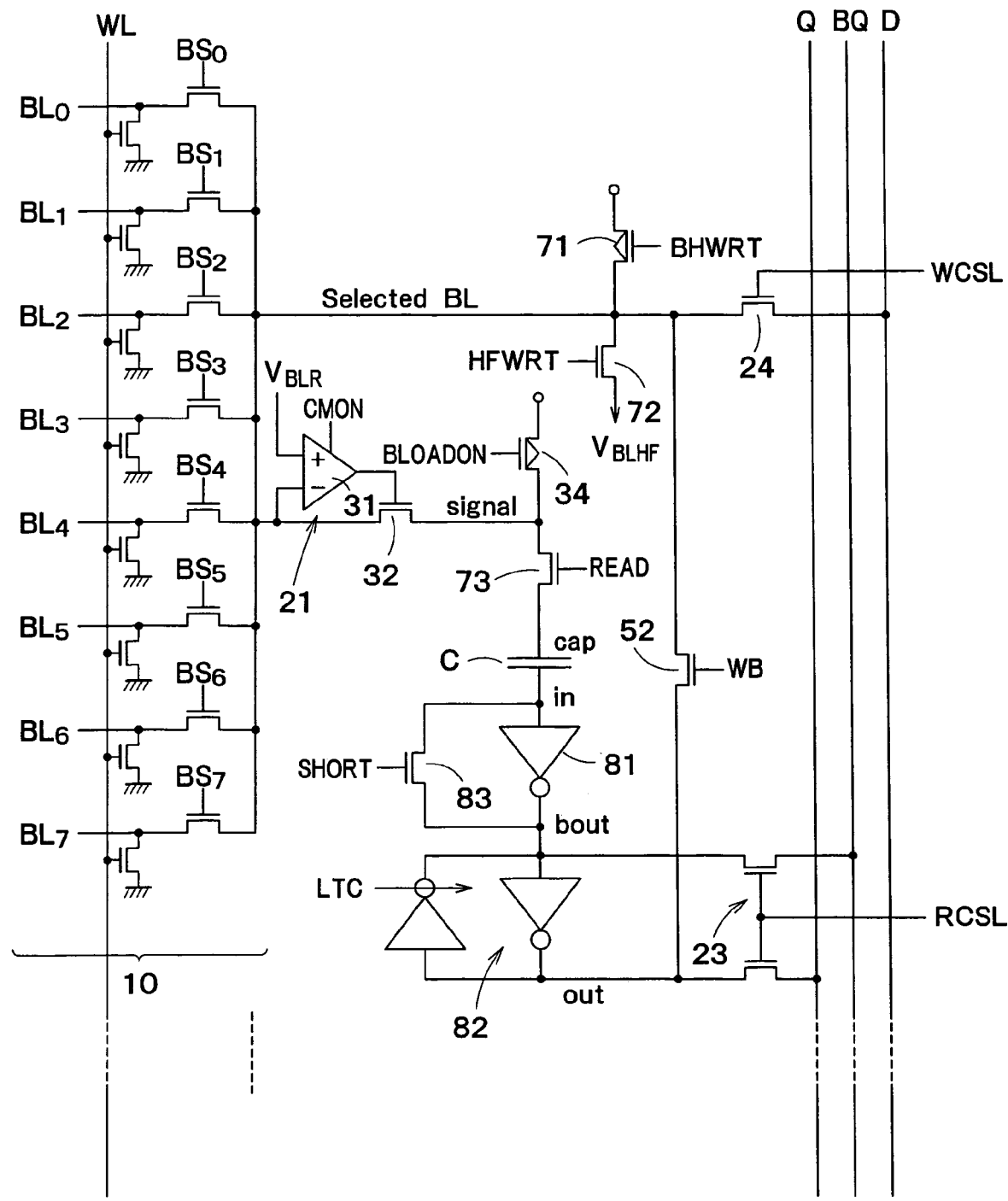
F I G. 17

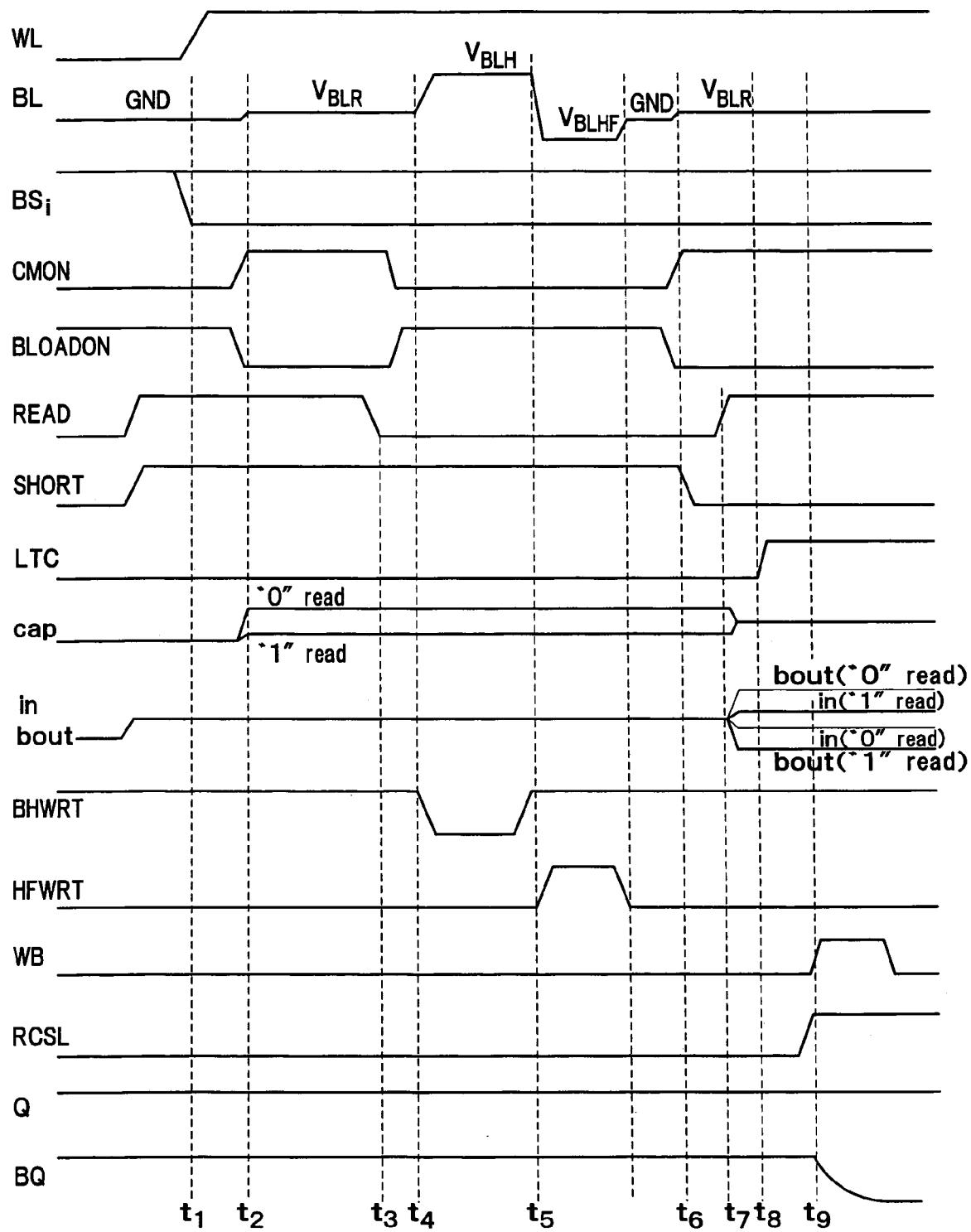
F I G. 18

"0"equilibrium-"0"equilibriumread-"1"write-"1"read
-"1/4"write-"1/4"read
Vwlh=1.5V, Vwll=-1.5V, Vblh=1.5V, Vblhf=-0.58V "0"equilibrium-"0"equilibriumread-"1"write-"1"read
-"1/2"write-"1/2"read
Vwlh=1.5V, Vwll=-1.5V, Vblh=1.5V, Vblhf=-0.36V

| $I_{cell}$ | $V_{1/4}$ | $V_{1/2}$ | $V_{3/4}$ | Bit0 | Bit1 |
|---|---|---|---|---|---|
| $I_0$ | 1 | 1 | 1 | 0 | 0 |
| $I_{3/8}$ | 0 | 1 | 1 | 0 | 1 |
| $I_{5/8}$ | 0 | 0 | 1 | 1 | 0 |
| $I_1$ | 0 | 0 | 0 | 1 | 1 |

FIG. 25

FLOATING BODY CELL MEMORY AND READING AND WRITING CIRCUIT THEREOF

CROSS REFERENCE TO RELATED APPLICATIONS

This application claims benefit of priority under 35 USC§119 to Japanese Patent Application No. 2003-341533, filed on Sep. 30, 2003, the entire contents of which are incorporated by reference herein.

BACKGROUND OF THE INVENTION

1. Field of the Invention

The present invention relates to a semiconductor integrated circuit device including a first semiconductor layer formed on a substrate via an embedded insulation film and an FBC (Floating Body Cell) for storing majority carriers in a floating channel body formed in the first semiconductor layer and thereby storing data.

2. Related Art

It may become difficult to fabricate a DRAM cell composed of a conventional one transistor and a trench capacitor or a stacked capacitor, as the DRAM cell becomes finer. As a memory cell that can be used instead of such a DRAM cell, a new memory cell FBC that stores majority carriers in a floating body of an FET formed on a SOI (Silicon on Insulator) or the like and thereby stores information has been proposed (See Japanese Patent Application Laid-Open Publication Nos. 2003-68877 and 2002-246571).

First, the principle of FBC writing and reading will now be described by taking an N type MISFET as an example. The state in which there are a large number of holes in the channel body is defined as "1", and the state in which there are a small number of holes in the channel body is defined as "0". The FBC includes an n-FET formed on a SOI substrate. The FBC is connected at its source to GND (0 V), connected at its drain to a bit line (BL), and connected at its gate to a word line (WL). The channel body of the FBC is electrically floating.

For writing "1", the transistor is operated in the saturation state. For example, the word line WL is biased to 1.5 V and the bit line BL is biased to 1.5 V. In such a state, a large number of electron-hole pairs are generated near the drain by impact ionization. Among them, electrons are absorbed to the drain terminal, but holes are stored in the channel body having a low potential.

In a state in which a current of holes generated by impact ionization balances a forward current of a pn junction between the channel body and the source, the channel body voltage arrives at the equilibrium state. The channel body voltage is approximately 0.7 V.

On the other hand, for writing "0" data, the bit line BL is pulled down to a negative voltage, for example, to −1.5 V. The channel body formed of a p-region and an n-region connected to the bit line BL are biased largely in the forward direction by the operation, and most of the holes stored in the channel body are emitted into the n-region. The state in which the number of holes in the channel body has decreased is "0".

For reading data, for example, the word line WL is set equal to 1.5V and the bit line is set equal to 0.2V to cause the transistor operate in the linear region. By using the effect (body effect) that the threshold voltage $V_{th}$ of the transistor differs due to difference in the number of holes stored in the channel body, the current difference is sensed to discriminate "1" and "0".

The reason why the bit line voltage is set to a low value (for example, to 0.2 V) when reading data is as follows: if the bit line voltage is set higher and the transistor is biased into the saturation state, there is a likelihood that the data may be disguised as "1" by impact ionization when reading "0" and "0" will not be able to be sensed correctly.

When reading data, the cell current flowing through the FBC is minute. In order to discriminate "1" and "0" accurately, therefore, typically a reference cell having the same structure as the FBC has is provided and a current difference between a cell current flowing through the FBC and a cell current flowing through the reference cell is sensed to discriminate "1" and "0" in data.

In some cases, however, the threshold value $V_{th}$ in a large number of FBCs in the memory disperses largely due to parameter variations in the device fabrication process. For example, if the channel length L of the transistor in the FBC disperses, the threshold value $V_{th}$ disperses largely due to the short channel effect. Furthermore, due to the dispersion in the channel width, the narrow channel effect works and the threshold value $V_{th}$ disperses.

In the future, it is expected that dispersion in positions and the number of impurity atoms existing in the channel largely affects the characteristics of the transistor as the transistor becomes finer. Inevitably, there is a likelihood that the threshold value $V_{th}$ may largely disperse.

If the dispersion in threshold value $V_{th}$ exceeds a certain tolerance, it becomes difficult in the sense scheme using the reference cell as described above to discriminate data "1" and "0" accurately. The reason is as follows: if $V_{th}$ in the FBC largely differs from $V_{th}$ in the reference cell, both of the potential obtained at the sense node when the data is "1" and the potential obtained at the sense node when the data is "0" become higher or lower than the potential $V_{REF}$ at the reference node. Therefore, the data "1" and "0" cannot be discriminated accurately.

The following sense amplifier is also conceivable. In order to conduct comparison with the reference cell, a reference cell for data "1" and a reference cell for data "0" are provided. By using the average of cell currents flowing through the reference cells of the two kinds as a reference current, comparison with the cell current flowing through the FBC is conducted.

However, a reference word line connected to the reference cell for the data "1" and a reference word line connected to the reference cell for the data "0" become necessary, and the number of word lines in the cell array increases. This results in a problem that current consumption increases. In order to cope with the increase of the current consumption, the mirror ratio in a current mirror circuit in the sense amplifier must be set equal to 2 and the circuit area of the sense amplifier increases. In addition, as a major problem, unbalance in capacitance between the bit line and the reference bit line cannot be avoided and it becomes impossible in the dynamic sense scheme to sense data normally, if the reference cell for data "1" and the reference cell for data "0" are provided.

In the above-described conventional FBC, one bit is formed of one transistor. As compared with the conventional DRAM cell in which one bit is formed of one transistor and one capacitor, the cell area becomes small and the conventional FBC is advantageous for realizing a large capacity.

However, there is a likelihood that the finer transistor technique will not be advanced unlike heretofore due to physical limits.

SUMMARY OF THE INVENTION

A semiconductor integrated circuit device according to one embodiment of the present invention, comprising:

a semiconductor layer formed via an embedded insulation film on a substrate;

an FBC (Floating Body Cell) which stores data by accumulating a majority carrier in a floating channel body formed on said semiconductor layer;

a reference cell connected to a reference bit line, said reference cell having the same size, shape and electric properties as those of said FBC (FLOATING BODY CELL);

an intermediate cell writing control circuit which performs control for writing intermediate data which is less than data "1" and larger than data "0" in the channel body of said reference cell; and a sense amplifier which performs control for reading out data stored in a selected FBC (FLOATING BODY CELL) based on the intermediate data read out from said reference cell.

Furthermore, a semiconductor integrated circuit device according to one embodiment of the present invention, comprising:

a semiconductor layer formed via an embedded insulation film on a substrate;

an FBC (FLOATING BODY CELL) (Floating Body Cell) which stores data by accumulating a majority carrier in a floating channel body formed on said semiconductor layer; and a sense amplifier which performs control for reading out data stored in said FBC (FLOATING BODY CELL), wherein said sense amplifier includes:

a hold circuit which holds by reading out data stored in a selected FBC (FLOATING BODY CELL);

a writing control circuit which performs control for reading out data stored in the selected FBC (FLOATING BODY CELL), writing data "1" into the selected FBC (FLOATING BODY CELL), and writing intermediate data less than data "1" and more than data "0" into the selected FBC (FLOATING BODY CELL); and a comparison circuit which reads out the intermediate data stored in the selected FBC (FLOATING BODY CELL), and compares the read-out data with data held by said hold circuit.

Furthermore, a semiconductor integrated circuit device according to one embodiment of the present invention, comprising:

a semiconductor layer formed via an embedded insulation film on a substrate;

an FBC (FLOATING BODY CELL) (Floating Body Cell) which stores data by accumulating a majority carrier in a floating channel body formed on said semiconductor layer; and a writing control circuit which performs control for writing $2^n$ types of potentials in the channel body of said FBC (FLOATING BODY CELL).

BRIEF DESCRIPTION OF THE DRAWINGS

FIG. 10 is a circuit diagram showing a detailed configuration of the reference potential generator circuit.

FIG. 12 is a circuit diagram showing a detailed configuration of the operational amplifiers 31 and 41 shown in FIG. 11.

FIG. 17 is a circuit diagram of the sense amplifier block 11 in the fifth embodiment.

FIG. 18 is an operation diagram for the circuit shown in FIG. 17.

FIG. 25 is a diagram showing a relationship for a comparison result between the cell current and the reference current, and 2 bits data stored in the FBC.

DETAILED DESCRIPTION OF THE INVENTION

Hereafter, embodiments of the present invention will be described with reference to the drawings.

(First Embodiment)

Figure 1:
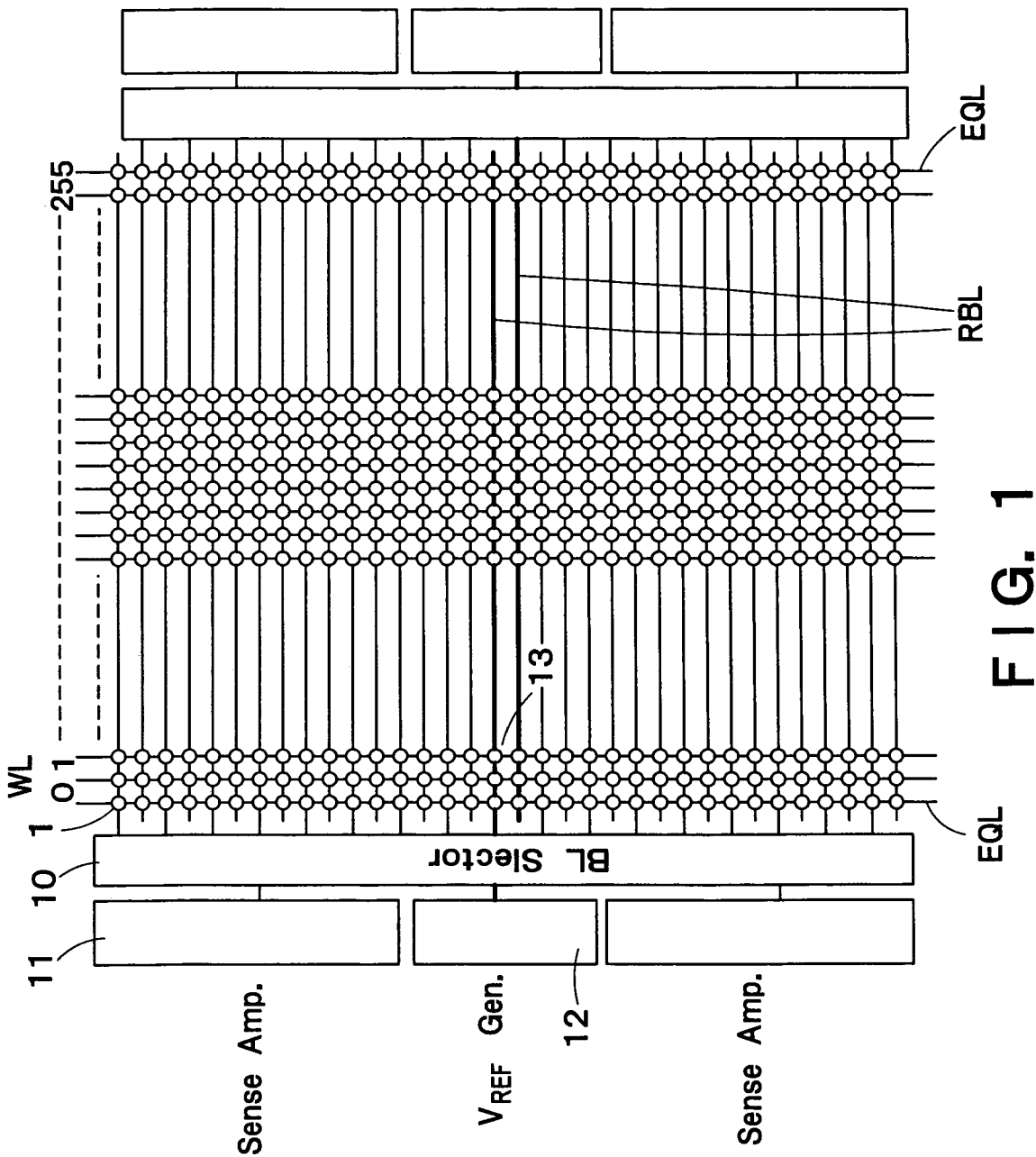
FIG. 1 is a block diagram showing a schematic configuration of a semiconductor integrated circuit device according to a first embodiment of the present invention.

FIG. 1 is a block diagram showing a schematic configuration of a semiconductor integrated circuit device according to a first embodiment of the present invention. FIG. 1 is a diagram obtained by picking out 256 word lines WL and 32 bit lines BL. Although the whole of one array is shown in the direction of the word line WL, only a part of the one array is shown in the direction of the bit line BL. In practice, a collection that is 32 times as large as the 32 bit lines BL, i.e., a collection having a total of 1,024 bit lines BL forms one array. And a memory is composed of a plurality of arrays.

Figure 2:
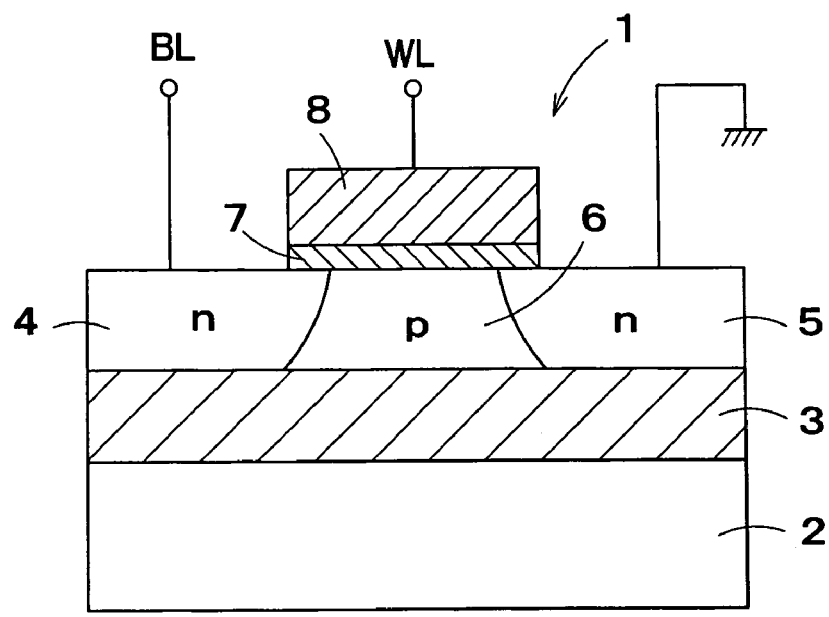
FIG. 2 is a sectional view showing a structure of a DRAM cell 1 using an n-channel MISFET.

A DRAM cell 1 formed of an FBC is connected to each of intersections of the word lines WL and the bit lines BL. The DRAM cell 1 is formed of one MISFET having a floating channel body. FIG. 2 is a sectional view showing a structure of a DRAM cell 1 using an n-channel MISFET. An insulation film 3 such as a silicon oxide film is formed on a silicon substrate 2. On the top surface of the insulation film 3, n-diffusion layers 4 and 5 and a p-diffusion layer 6, which are separated from the silicon substrate 2, are formed. The n-diffusion layers 4 and 5 become a source region and a drain region, respectively. The p-diffusion layer 6 becomes a channel body. A gate electrode 8 is formed on the top surface of the p-diffusion layer 6 via a gate insulation film 7.

Figure 3:
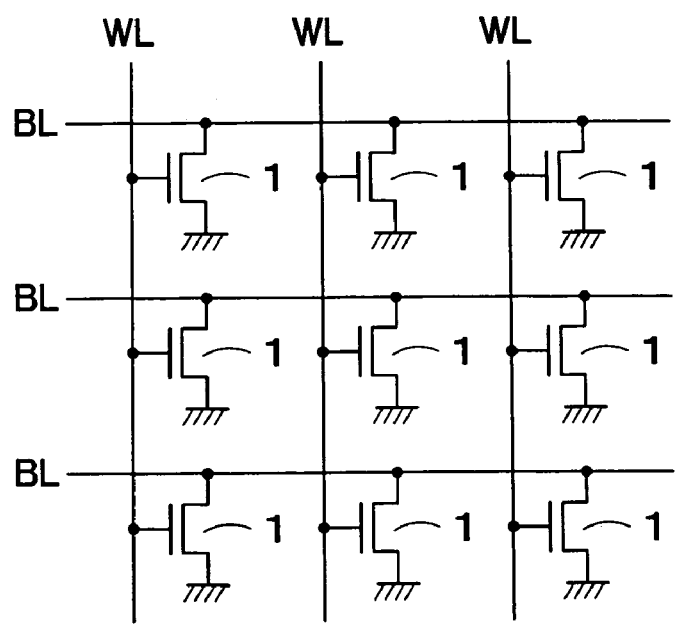
FIG. 3 is a circuit diagram of an array of the DRAM cells 1.

FIG. 3 is a circuit diagram of an array of the DRAM cells 1. A common word line WL is connected to gates of the DRAM cells 1 arranged in a row direction, and a common bit line BL is connected to drains of the DRAM cells 1 arranged in a column direction. Sources of all DRAM cells 1 are set to a reference potential (ground potential). Each DRAM cell 1 has a floating channel body separated from other DRAM cells 1.

The DRAM cell 1 dynamically stores a first data state, in which a p-type silicon layer serving as a channel body is set to a first potential, and a second data state, in which the p-type silicon layer is set to a second potential. Specifically, the first data state is written by applying a high level voltage to a selected word line and a selected bit line, causing a selected DRAM cell 1 to conduct pentode operation, causing impact ionization near its drain, and holding majority carriers (which are holes in the case of the n-channel) thus generated in a channel body. This is, for example, data "1". The second data state is written by applying a high level voltage to a selected word line, making the channel body potential high by capacitive coupling, setting a selected bit line to a low level, letting flow a forward bias current through a junction between a channel body and a drain of the selected DRAM cell 1, and emitting majority carriers in the channel body into the drain. This is, for example, data "0".

The data "1" and "0" appear as differences in gate threshold value of The MISFET. As a result of the substrate bias conducted by the channel body potential, a threshold value $V_{th1}$ in the case of "1" becomes lower than a threshold value $V_{th0}$ in the case of "0". Therefore, data read out can be discriminated by detecting a difference in cell current caused by a difference in threshold voltage.

As shown in FIG. 1, bit lines are connected alternately to left and right bit line selector circuits 10. A signal that appears in a bit line selected by a line selector circuit 10 is amplified by a sense amplifier 11 in a sense amplifier block 11, and latched by a latch circuit 22, which will be described later and shown in FIG. 8. In a central part of bit lines arranged in the longitudinal direction, two reference bit lines RBL are provided and are connected respectively to reference potential generator circuits 12. Reference cells 13 having the same circuit configuration and electrical characteristics as those of FBCs are connected to intersections of the reference bit lines RBL and the word lines. The sense amplifier block 11 and the reference potential generator circuit are shared by adjacent arrays.

The FBCs are cells of nondestructive type. Even if a word line is activated and cell data of an FBC is read out, therefore, the cell data is not destroyed. Therefore, a circuit for writing back the cell data read out is not necessary.

The bit line selector circuit 10 selects one out of eight bit lines and transmits it to the sense amplifier block 11. In other words, one sense amplifier block 11 is provided every eight bit lines.

The present embodiment has a feature that middle data "1/2" between data "1" and "0" is written into the reference cells 13. When a word line connected to a reference cell 13 having data "1/2" written thereto is activated, a current of $(I_1+I_0)/2$, which is an average of a cell current $I_1$ flowing through an FBC having data "1" written thereto and a cell current $I_0$ flowing through an FBC having data "0" written thereto, flows through the reference bit lines RBL.

When the cell array is in a standby state, a signals EQL shown in FIG. 1 becomes the high level and precharges all bit lines and reference bit lines RBL to GND.

Figure 4:
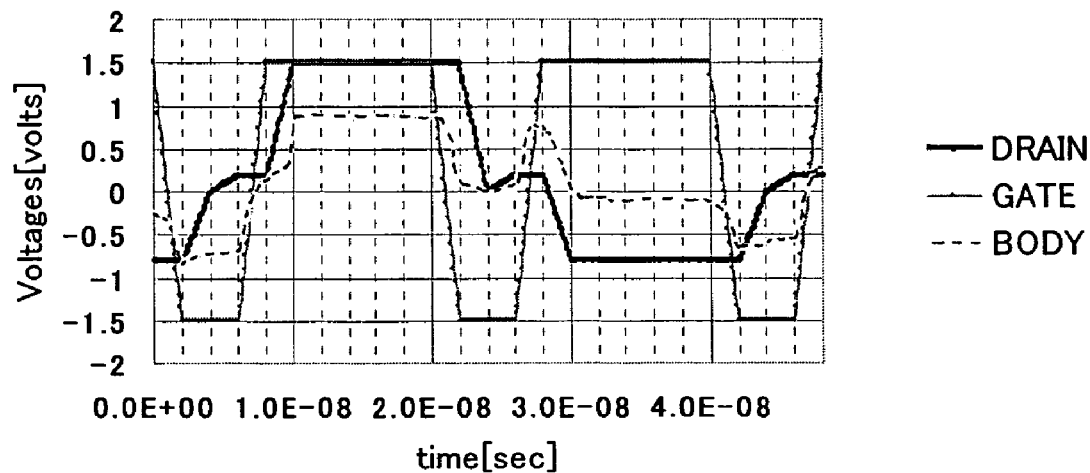
FIG. 4 is a diagram showing a device simulation result of an FBC at 27° C.

Hereafter, the reason why an intermediate potential can be written to a reference cell 13 will be first described. FIG. 4 is a diagram showing a device simulation result of an FBC at 27° C. A result obtained by starting from an equilibrium state (0 ns) of "0" data, writing "1" in a former half (10 ns to 20 ns), then reading the data (26 ns to 28 ns), writing "0" in a latter half (30 ns to 40 ns), and then reading the data (46 ns to 48 ns), i.e., by conducting a transient analysis is shown.

The FBC used in the simulation of FIG. 4 is an n-FET having a channel length L=0.15 μm, channel width W=0.175 μm, gate insulation film thickness $t_{ox}$=60 Angstrom ($6\times10^{-9}$ m), silicon film thickness $t_{si}$=550 Angstrom ($5.5\times10^{-8}$ m), embedded oxide film $t_{BOX}$=200 Angstrom, and channel impurity concentration NA=$7.0\times10^{17}$ cm$^{-3}$. The gate (word line) voltage is −1.5 V at the time of data holding (2 ns to 6 ns, 22 ns to 26 ns and 42 ns to 46 ns). The gate (word line) voltage is 1.5V at the time of writing (0 ns, 10 ns to 20 ns and 30 ns to 40 ns) and at the time of reading (8 ns, 28 ns, and 48 ns). The drain (bit line) voltage is 1.5 V in the case of "1" writing (10 ns to 20 ns), and −0.8 V in the case of "0" writing (0 ns and 30 ns to 40 ns). The bit line voltage is 0.2 V at the time of reading (6 ns to 8 ns, 26 ns to 28 ns and 46 ns to 48 ns).

The word line voltage and the bit line voltage are signals input from the outside, and the channel body "BODY" voltage is a value calculated by simulation.

Figure 5:
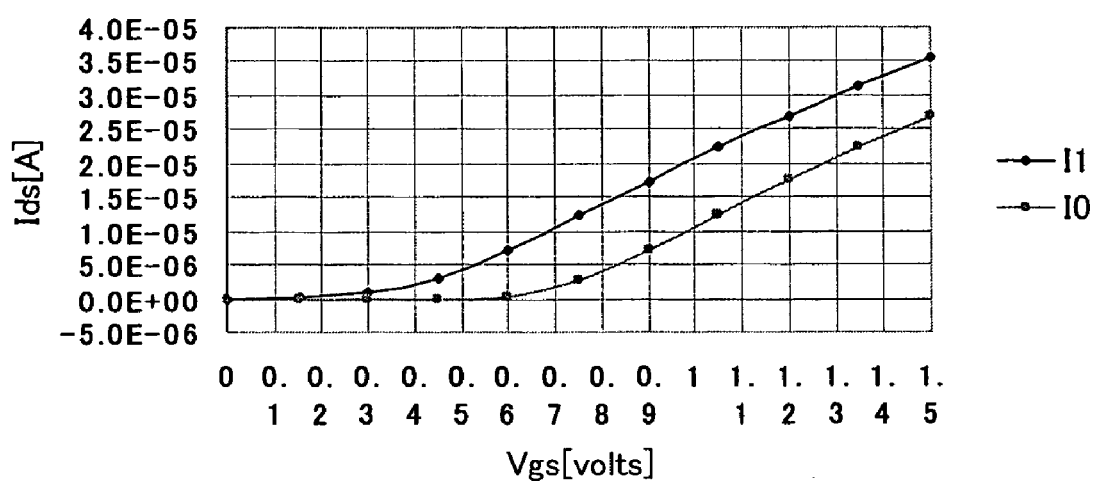
FIG. 5 is a diagram showing a relationship between the cell current and the gate voltage obtained from the simulation shown in FIG. 4.

FIG. 5 is a diagram showing a relationship between the cell current and the gate voltage obtained from the simulation shown in FIG. 4. Specifically, a current $I_1$ corresponding to "1" data is $I_{ds}$ (a current flowing between the drain and source) observed between 26 ns and 28 ns, and a current $I_0$ corresponding to "0" data is $I_{ds}$ observed between 46 ns and 48 ns.

In the FBC having the structure as shown in FIG. 4, the "1" data current has a threshold of 0.4 V and the "0" data current has a threshold of 0.7 V. The difference in threshold is 0.3 V.

Figure 6:
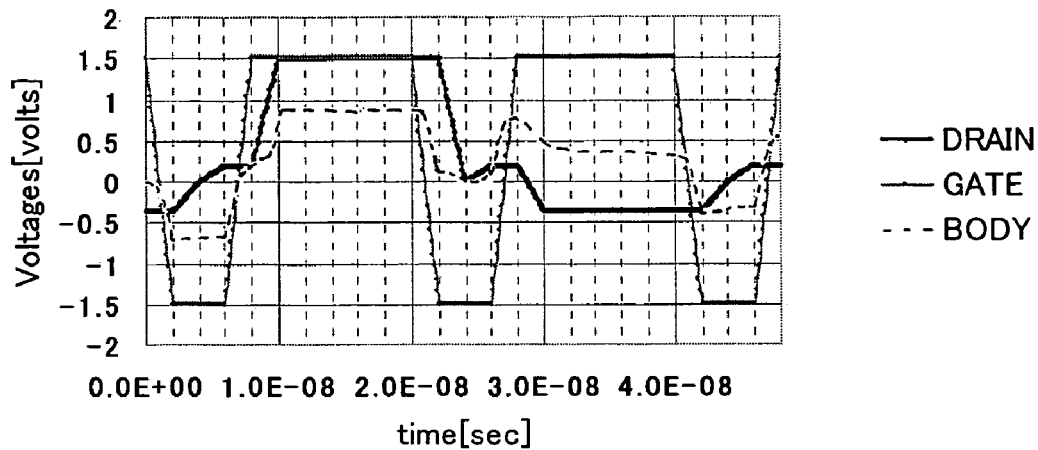
FIG. 6 is a diagram showing a simulation result for an FBC having the same structure at 27° C. obtained by starting from an equilibrium state of "0", writing "1" data in the same way as FIG. 5, then reading it, thereafter writing "0" with a bit line potential of −0.36 V, which is smaller in absolute value than the value (−0.8 V) in FIG. 4.

On the other hand, FIG. 6 shows a simulation result for an FBC having the same structure at 27° C. obtained by starting from an equilibrium state of "0", writing "1" data in the same way as FIG. 5, then reading it, thereafter writing "0" with a bit line potential of −0.36 V, which is smaller in absolute value than the value (−0.8 V) in FIG. 4, and subsequently reading it.

Figure 7:
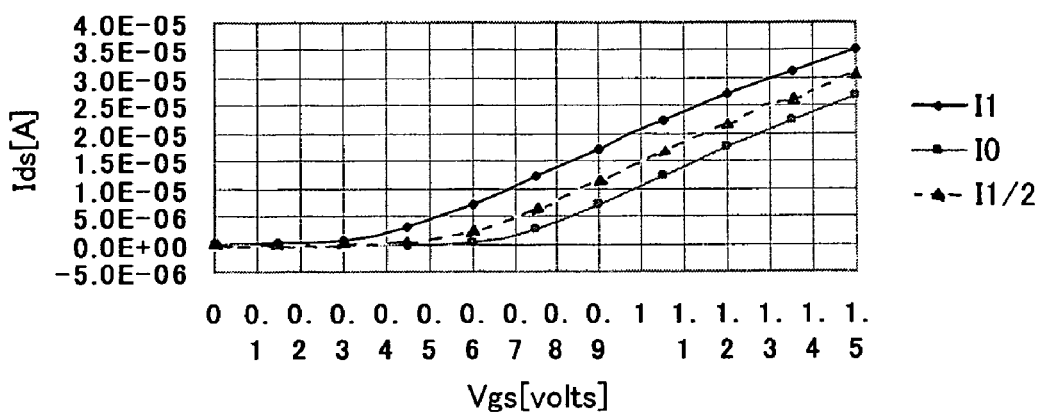
FIG. 7 is a diagram obtained by monitoring a current $I_{1/2}$ at the time of reading during 46 to 48 ns in FIG. 6, and superposing it on FIG. 5.

FIG. 7 is a diagram obtained by monitoring a current $I_{1/2}$ at the time of reading during 46 to 48 ns in FIG. 6, and superposing it on FIG. 5. As appreciated from FIG. 7, $I_{1/2}$ is located nearly in the middle of $I_0$ and $I_1$. Its threshold voltage is approximately 0.57 V.

The reason why $I_{1/2}$ becomes a value different from $I_0$ and $I_1$ will now be described. The "1/2" data can be written into the FBC by writing "1", setting the bit line to a negative potential from the state in which a large number of holes are stored in the floating body, and biasing the pn junction between the channel body and the drain in the forward direction. According to the magnitude of the bit line potential, however, the number of holes emitted from the FBC in a short time such as several ns differs. As a result, the number of holes remaining in the body differs, and the work of the body effect changes. A difference occurs between the current $I_0$ of "0" data and the current $I_{1/2}$ in the case where the bit line is brought to the middle state "1/2".

In the present embodiment, by using the above mentioned technique, "1" data is written into the reference cell 13, and then "1/2" data which is the intermediate potential is written into the reference cell 13 by setting the bit line to a negative potential.

Figure 8:
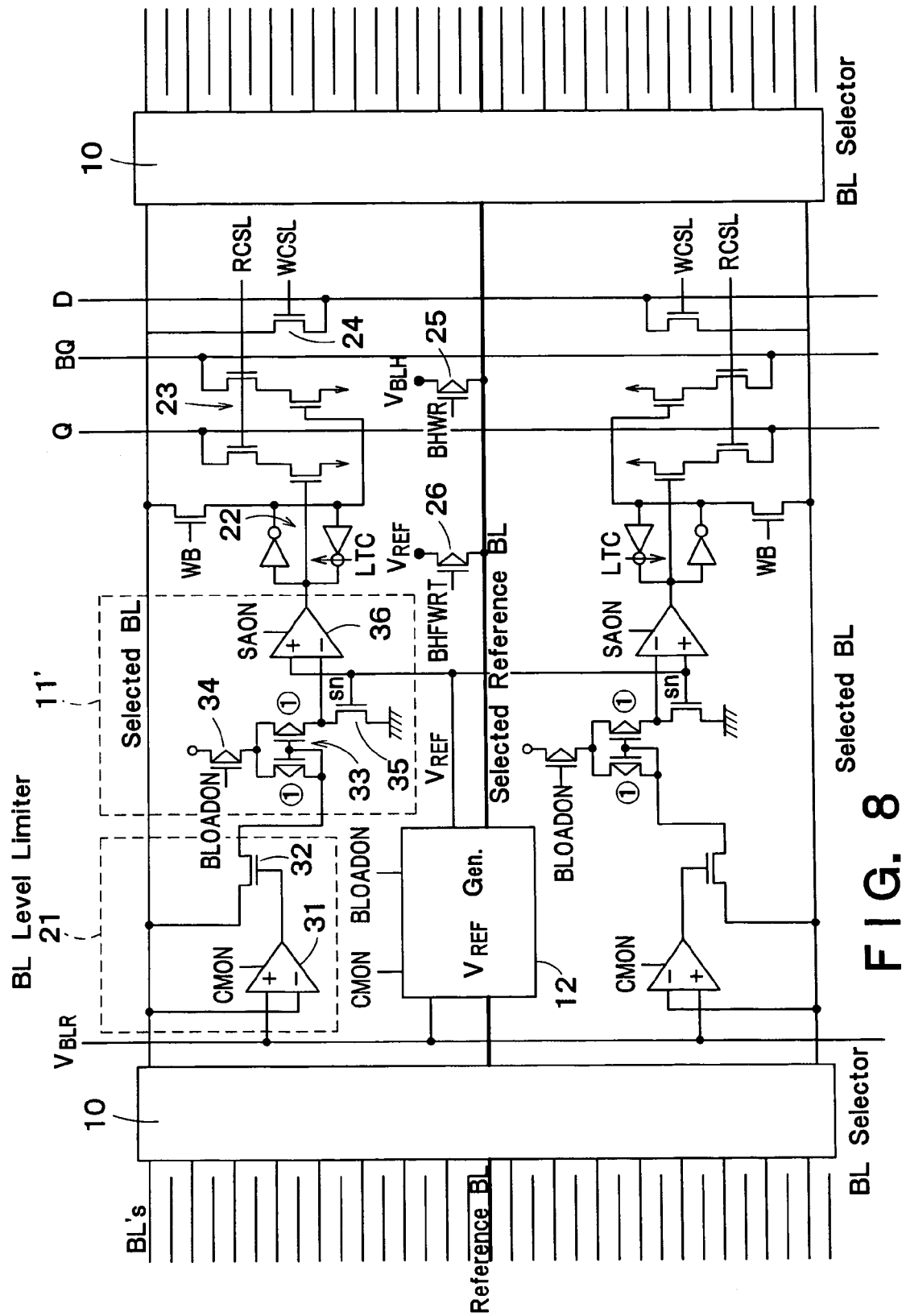
FIG. 8 is a circuit diagram in the vicinity of the sense amplifier block 11 according to the first embodiment shown in FIG. 1.
Figure 9:
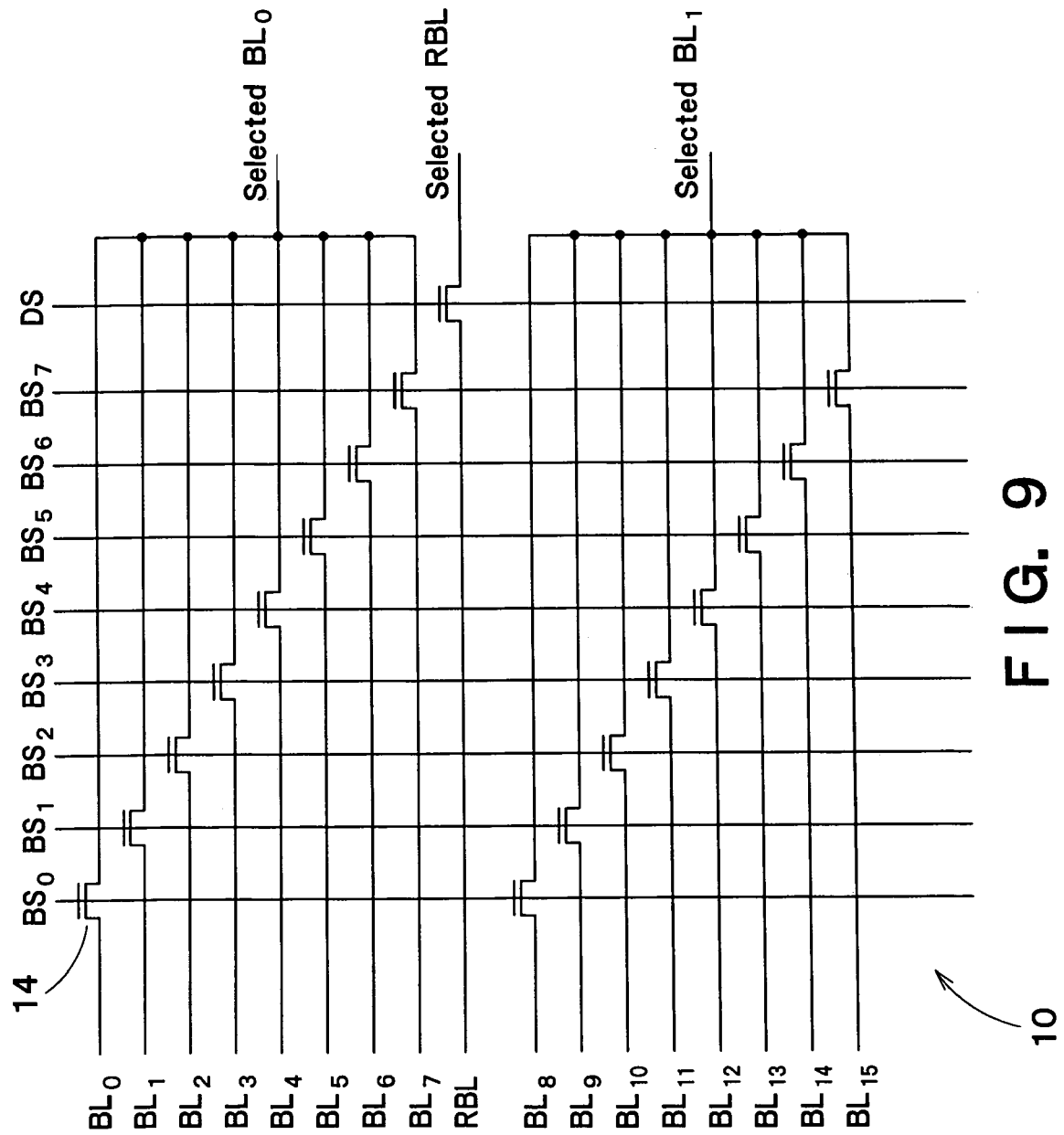
FIG. 9 is a circuit diagram showing a detailed configuration of the bit line selector circuit.

FIG. 8 is a circuit diagram in the vicinity of the sense amplifier block 11 according to the first embodiment shown in FIG. 1. A bit line selector circuit 10 of FIG. 8 selects one bit line out of eight bit lines. A detailed configuration of the bit line selector circuit 10 is represented by, for example, a circuit diagram shown in FIG. 9. The bit line selector circuit 10 of FIG. 9 includes a plurality of transistors 14 connected to bit lines and a reference bit line RBL. The bit line selector circuit 10 sets any one of signals $BS_0$ to $BS_7$, which are input to gates of these transistors 14, and DS to a high level, and thereby turns on any one transistor 14 and a transistor 14 supplied with the DS.

The circuit of FIG. 8 includes a level limiter 21 for limiting the potential so that a potential on a selected bit line becomes a predetermined reference potential or less becomes, a sense amplifier 11', a latch circuit 22 for latching an output of the sense amplifier 11', a read control circuit 23, a write control circuit 24, a reference potential generator circuit 12 connected to a reference bit line RBL, a high potential setting transistor 25 for setting a selected reference bit line RBL, which is output from the reference potential generator circuit 12, to a "1" potential, and an intermediate potential setting transistor 26 for setting the selected reference bit line RBL to an intermediate potential.

The level limiter 21 includes an operational amplifier 31 for outputting a potential depending upon a potential difference between the potential on the selected bit line and a reference potential $V_{BLR}$, and a transistor 32 for conducting negative feedback control on the potential on the selected bit line according to an output of the operational amplifier 31.

At the time of data reading, the level limiter 21 limits the bit line potential to the reference potential $V_{BLR}$ (for example, 0.2 V). As a result, the cell operation at the time of data reading is limited to a linear region, and false operation caused by impact ionization is prevented.

The sense amplifier 11' includes a current mirror circuit 33 through which the same current as a cell current of FBC 1 flows, a p-FET 34 forming a current source for the current mirror circuit 33, n-FETs 35, and an operational amplifier 36 for outputting a voltage that depends upon a potential difference between an output potential from the current mirror circuit 33 and a reference potential $V_{REF}$.

After the bit line selector circuit 10 has selected a bit line, signals CMON and BLOADON respectively become the high level and the low level, and thereby the current mirror circuit 33 is activated. As a result, the cell current $I_0$ or $I_1$ flows through the FBC 1. A current of $(I_0+I_1)/2$ flows through the reference bit line RBL.

Since the mirror ratio of the current mirror circuit 33 is 1, a current of $I_0$ or $I_1$ flows from a high power supply side to a sense node sn, which is a (−) input terminal of the operational amplifier 36.

On the other hand, the reference potential generator circuit 12 is formed of, for example, a circuit shown in FIG. 10. The reference potential generator circuit 12 shown in FIG. 10 includes an operational amplifier 41 for comparing the potential on the reference bit line RBL with the intermediate potential $V_{BLR}$, a transistor 42 for conducting negative feedback control on the potential on the reference bit line RBL on the basis of an output of the operational amplifier 41, a current mirror circuit 43 including p-FETs, a p-FET 44 forming a current source for the current mirror circuit 43, and a diode-connected n-FET 45 connected to the current mirror circuit 43.

The current mirror circuit 43 has a mirror ratio of 1. The n-FET 45 in the reference potential generator circuit 12 and the n-FET 35 in the sense amplifier 11 form a current mirror circuit having a mirror ratio of 1. In the case where the cell current is $I_0$ (<$I_1$), therefore, the potential at the sense node sn becomes $V_{REF}-\alpha$ (where $V_{REF}$ is approximately equal to 1 V and $\alpha$ is approximately equal to 0.6 V). Conversely, in the case where the cell current is $I_1$ (>$I_0$), the potential at the sense node sn becomes $V_{REF}+\alpha$.

A signal SAON, which activates the current mirror circuit when it is at its high level, is also activated to its high level at the substantially same time that the signal CMON is activated. Thereupon, a potential difference between $V_{REF}$ and $V_{REF}\pm\alpha$ is amplified by a current mirror circuit in the operational amplifier 36 supplied with the signal SAON, and the amplified potential difference is latched by the subsequent latch circuit 22.

At the time of data reading, a read column selection signal RCSL is risen on the basis of a column address. A latch output of the latch circuit 22 is finally read out to the outside as data via a read line pair Q and BQ.

At the time of refresh, a write back signal WB is activated. As a result, the latched data is written back to a bit line and rewriting is conducted on the selected FBC.

At the time data writing, a write column selection signal WCSL is risen on the basis of a column address. Write data, which is input from the outside via a signal line D, is written to the bit line.

The intermediate potential setting transistor 26 is composed of a p-FET 26 supplied with a signal BHFWRT at its gate. When writing "1/2" into the reference cells 13, the signal BHFWRT is set to a low level to turn on the p-FET 26 and a voltage $V_{BLHF}$ is written into the reference cells 13.

Judging from the device simulation results shown in FIGS. 6 and 7, a suitable value of $V_{BLHF}$ is approximately −0.36V. However, this value is suitable when $V_{BLL}$ (bit line level at the time of "0" writing) is −0.8 V and $V_{BLH}$ (bit line level at the time of "1" writing) is 1.5 V. In the case where the $V_{BLL}$ and $V_{BLH}$ have changed, it is necessary to adjust the value of the $V_{BLHF}$.

If a word line is set to a negative potential and "1/2" data is held in the reference cells 13, holes are stored in the body because of a leak current in the pn junction or a leak current caused by band-to-band tunneling such as GIDL (Gate Induced Drain Leak) and the "1/2" data is changed to "1" data after a long time has elapsed.

Thereafter, it is necessary to conduct writing to the voltage of $V_{BLHF}$ in a time interval that is equal to or less than that used when refreshing an ordinary cell.

In the simulation shown in FIG. 4, "1" data is written and thereafter "1/2" data is written. However, it is operation required when cell data obtained immediately before "1/2" data is written has a body potential lower than "1/2". After "1/2" data is written, it naturally changes in the direction of "1" (i.e., the body potential changes from the state of "1/2" data into a direction of a higher potential) in the actual situation in use. Therefore, previous operation of "1" writing is considered to be unnecessary.

In the case where the time during which the p-region in the channel body is biased in the forward direction with respect to the n-type source node having the GND level is long, however, it is also considered that the body potential in the reference cell 13 to which "1/2" has been written at the beginning might become lower than the "1/2" potential when the word line becomes the high level. In some cases, therefore, it is necessary to write "1" before writing into the reference cell 13 for the purpose of safety. In FIG. 8, therefore, the high potential setting transistor 25 for writing "1" into the reference cell 13 is provided. This high potential setting transistor 25 is formed of a p-FET. For writing the intermediate potential, first the p-FET 25 is turned on and the "1" potential $V_{BLH}$ is written into the reference cell 13, and thereafter the signal BHFWRT is set to the low level and the "1/2" potential $V_{BLHF}$ is written into the reference cell 13.

The series of operations is conducted over the whole cell array activated irrespective of the column selection line. Therefore, "1/2" writing is conducted simultaneously on all reference cells 13 connected to activated word lines. It is also possible to conduct "1/2" writing selectively only on a reference bit line RBL selected by a column selection line.

In this way, in the first embodiment, the logic of data is discriminated by previously writing the intermediate potential into the reference cell 13 and comparing data read out from the FBC 1 with data read out from the reference cell 13. Therefore, it becomes unnecessary to individually provide a reference cell 13 for data "1" and a reference cell 13 for data "0". Thus, the circuit configuration can be simplified. In addition, since the mirror ratio of the current mirror circuit in the sense amplifier 11 can be set to 1, the circuit size can be reduced.

(Second Embodiment)

In a second embodiment, a dynamic sense amplifier 11 of voltage sense type is provided.

Figure 11:
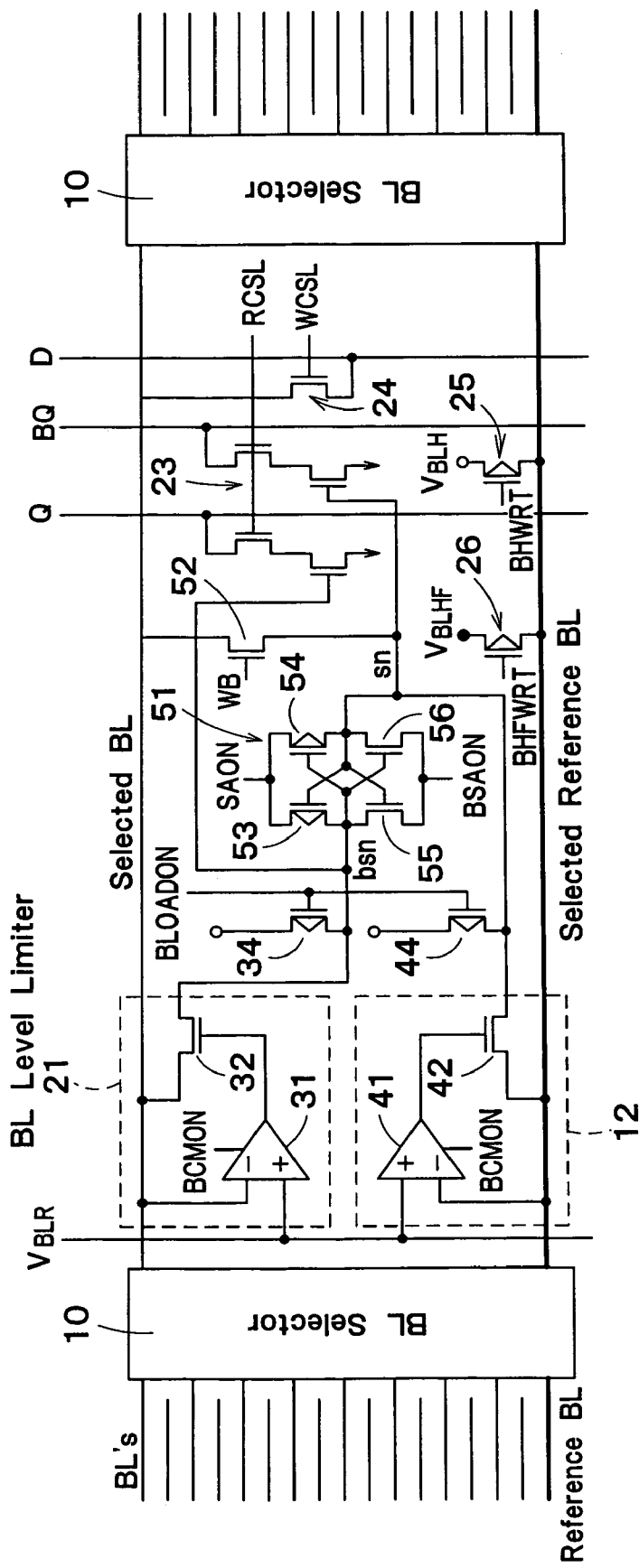
FIG. 11 is a circuit diagram according to a second embodiment of the sense amplifier block.

FIG. 11 is a circuit diagram according to a second embodiment of the sense amplifier block 11. In FIG. 11, components common to FIG. 8 are denoted by like characters, and hereafter different points will be mainly described.

The sense amplifier shown in FIG. 11 is a dynamic sense amplifier of voltage sense type. The sense amplifier includes a latch circuit 51 for latching a potential difference between an output node bsn of a level limiter 21 and an output node sn of a reference potential generator circuit 12, a p-FET 25 for conducting switching control to determine whether to set the reference bit line RBL to the "1" potential, a p-FET 26 for conducting switching control to determine whether to set the reference bit line RBL to the "1/2" potential, a write back control transistor 52, a read control circuit 23, and a write control circuit 24.

The latch circuit 51 includes cross-coupled p-FETs 53 and 54 and n-FETs 55 and 56. Gates of the p-FET 54 and n-FET 56 are connected to the node bsn, and gates of the p-FET 53 and n-FET 55 are connected to the node sn. Sources of the p-FETs 53 and 54 are supplied with a signal SAON, and sources of the n-FETs 55 and 56 are supplied with a signal BSAON.

FIG. 12 is a circuit diagram showing a detailed configuration of the operational amplifiers 31 and 41 shown in FIG. 11. As illustrated, each of the operational amplifiers 31 and 41 includes n-FETs 57 and 58 forming a differential amplifier, a current mirror circuit including p-FETs 59 and 60 connected to the differential amplifier, a p-FET 61 forming a current source, and an output transistor 62.

After a word line WL, which is not illustrated, is activated and any one bit line is selected by a bit line selector circuit 10, signals BLOADON and BCMON become the low level. As a result, the p-FETs 34 and 44 turn on, and cell currents flow through a bit line BL and a reference bit line RBL. In this state, both the activation signals SAON and BSAON for the latch circuit 51 are at the GND level (precharge level of the bit line), and the latch circuit 51 is not yet in operation.

At a point in time in which signals are sufficiently transmitted to the nodes sn and bsn, the signals BLOADON and BCMON become the high level to cut off the signals sn and bsn respectively from the reference bit line RBL and the bit line BL and bring the signals sn and bsn to a floating state.

Immediately thereafter, the signal SAON is set to the high level and the signal BSAON is set to the low level in order to activate the latch circuit 51. As a result, the latch circuit 51 amplifies a potential difference between the nodes sn and bsn, and latches data.

Thereafter, a read column selection line RCSL is set to the high level, and the data latched by the latch circuit 51 is transmitted to a readout line pair Q and BQ.

On the other hand, at the time of refresh operation, a write back signal WB is set to the high level and the data latched by the latch circuit 51 is written into the selected FBC. As for the reference cell 13, a signal BHFWRT becomes the low level, and an intermediate level $V_{BLHF}$ between "1" and "0" is written into the reference cell 13 via the reference bit line RBL. Prior to this operation, however, a signal BHWRT becomes the low level and "1" is written into the reference cell 13.

In this way, in the second embodiment, the sense amplifier 11 of voltage sense type is provided to conduct sensing. Because of this, as compared with the first embodiment, the circuit configuration can be simplified.

(Third Embodiment)

A third embodiment is a variant of the second embodiment.

Figure 13:
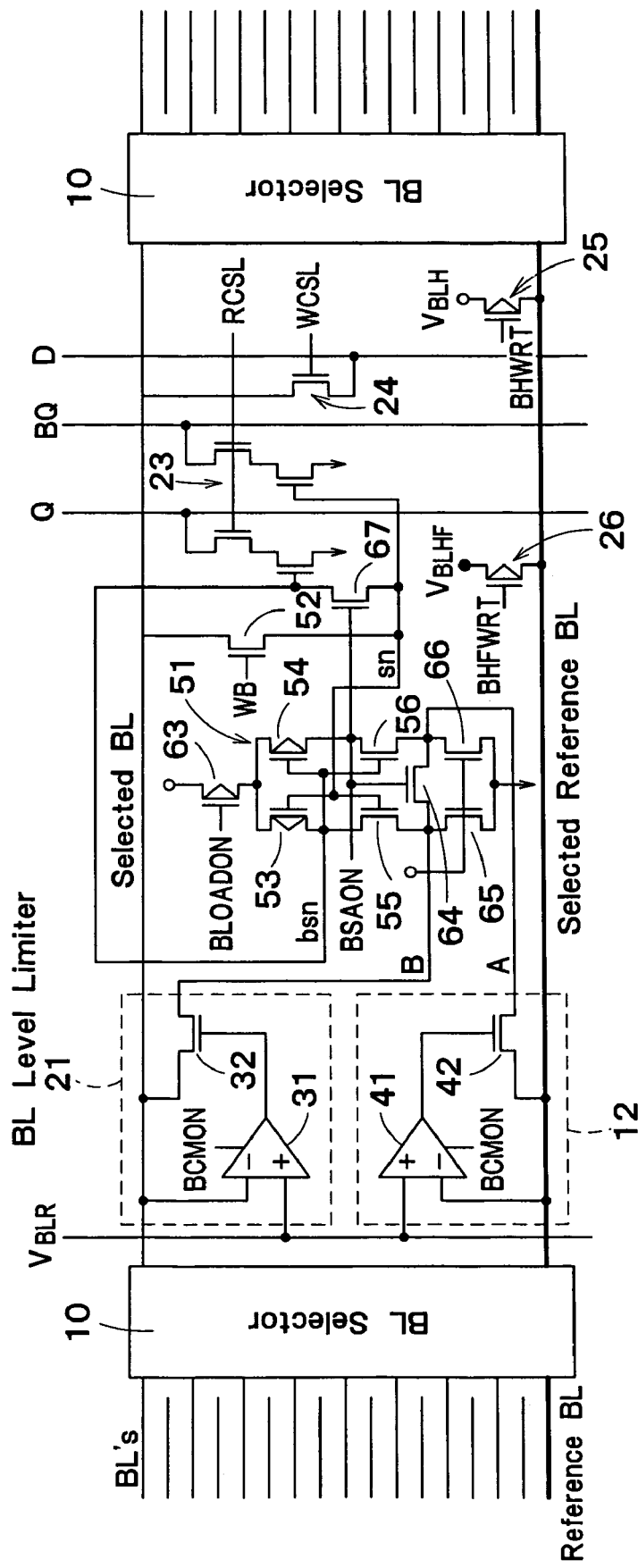
FIG. 13 is a circuit diagram of a third embodiment of the sense amplifier block.

FIG. 13 is a circuit diagram of a third embodiment of the sense amplifier block 11. In FIG. 13, components common to FIG. 11 are denoted by like characters, and hereafter different points will be mainly described.

The sense amplifier shown in FIG. 13 is the same as the circuit described in detail in T. N. Blalock and R. C. Jaeger, "A High-Speed Clamped Bit-Line Current-Mode Sense Amplifier," IEEE J. Solid State Circuits, vol. 26, No. 4, pp. 542–548, April 1991.

The sense amplifier shown in FIG. 13 is different in the configuration of the latch circuit 51 from the sense amplifier shown in FIG. 11. The latch circuit 51 shown in FIG. 13 includes a p-FET 63 and n-FETs 64 to 67 besides the p-FETs 53 and 54 and the n-FETs 55 and 56. The p-FET 53, n-FET 55 and n-FET 65 are connected in cascade. The p-FET 54, n-FET 56 and n-FET 66 are connected in cascade.

The output of the level limiter 21 is connected to a node between the n-FETs 55 and 65. The output of the reference potential generator circuit 12 is connected to a node between the n-FETs 56 and 66. The n-FET 67 conducts switching control to determine whether to short-circuit a path between the nodes sn and bsn on the basis of the logic of the signal BSAON.

If a word line WL is activated and the bit line selector circuit 10 has selected a bit line, and then a signal BLOADON becomes the low level, cell currents flow to the FBC and the reference cell 13 respectively through the bit line and the reference bit line RBL. Since a signal BSAON is at the high level at this time, the complementary sense nodes sn and bsn are short-circuited to each other and are at the same potential. In the same way, an output node A of the level limiter 21 and an output node B of the reference potential generator circuit 12 are also short-circuited to each other and are at the same potential.

If the signal BSAON becomes the low level, then the sense nodes sn and bsn are disconnected from each other and the nodes A and B are disconnected from each other. Thus, positive feedback is applied between the sense nodes sn and bsn because of the difference between the cell current and the current of the reference cell 13, and a potential difference is formed at high speed. In this way, the signal can be latched.

When reading data to the outside thereafter, a read control circuit 23 is turned on by a read column selection line RCSL selected on the basis of a column address and data is read to a data line pair Q and BQ.

When conducting the refresh, the signal WB is activated and the latched signal is written into the FBC via a bit line.

On the other hand, as for writing into the reference cell 13, a negative pulse is generated on the signals BHWRT and BHFWRT in order and finally "1/2" data is written in the same way as the first and second embodiments.

The sense amplifier of the present embodiment has a feature that the cell current $I_1$ corresponding to "1" data or the cell current $I_0$ corresponding to "0" data flows into a first current input end of the latch circuit 51, and a reference current $I_{1/2}$ from the reference potential generator circuit 12 flows into a second input end of the latch circuit 51 via the node A having the same capacity as the bit line, in a highly symmetric form. It is difficult to realize such a circuit configuration in the sense amplifier 11 in which the current (I0+I1) flows through the reference bit line RBL.

On the other hand, the sense amplifier described with reference to the first and second embodiments can also be applied to a semiconductor integrated circuit device in which $I_0+I_1$ flows to the reference line RBL.

Thus, in the third embodiment, sensing is conducted by a sense amplifier of voltage sense type similarly to the second embodiment and consequently the circuit configuration can be simplified as compared with the first embodiment.

(Fourth Embodiment)

Figure 14:
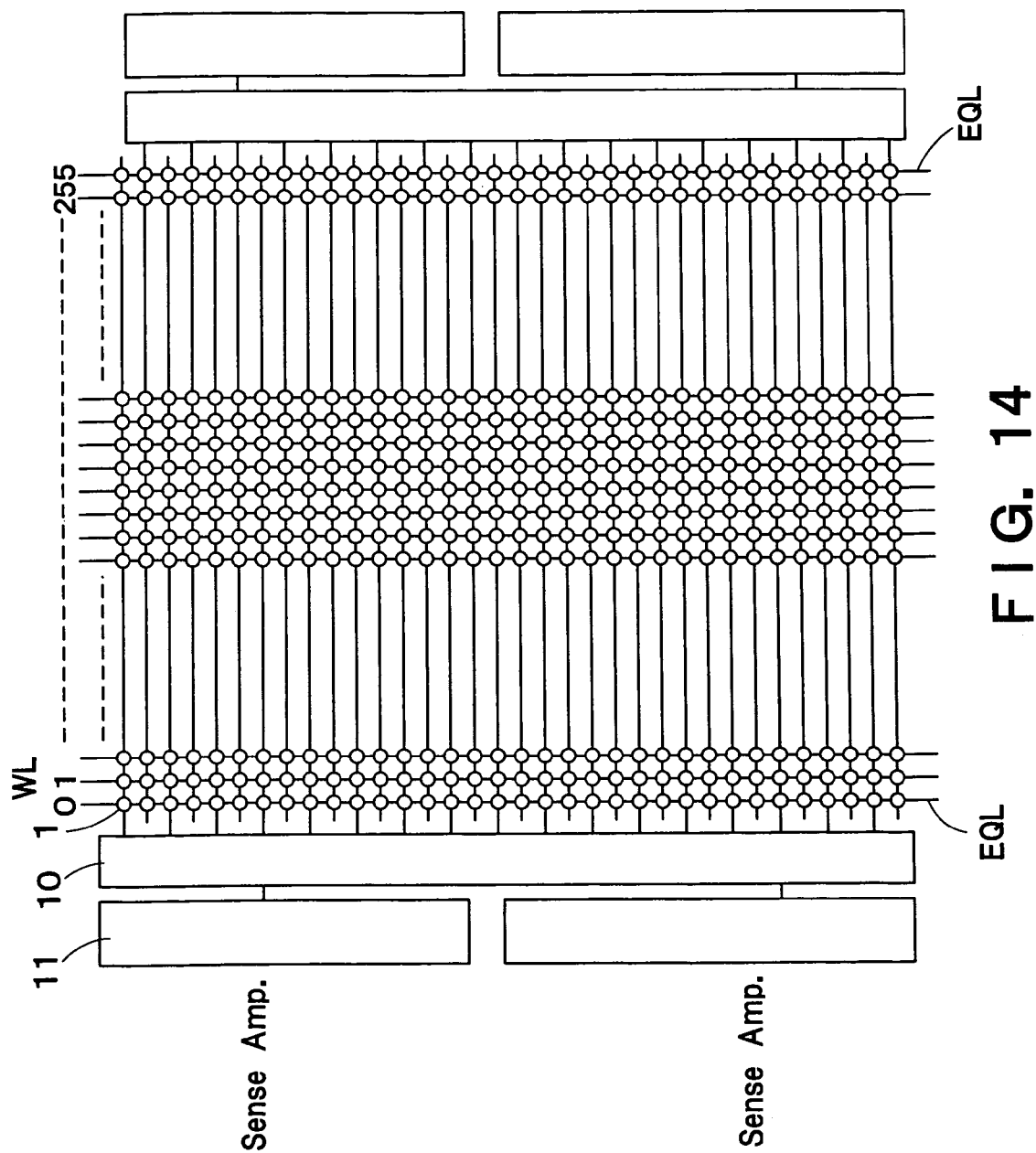
FIG. 14 is a block diagram showing a schematic configuration of a fourth embodiment of a semiconductor integrated circuit device according to the present invention.

FIG. 14 is a block diagram showing a schematic configuration of a fourth embodiment of a semiconductor integrated circuit device according to the present invention. The semiconductor integrated circuit device shown in FIG. 14 is obtained by omitting the reference cells and reference bit lines from the configuration shown in FIG. 1.

Figure 15:
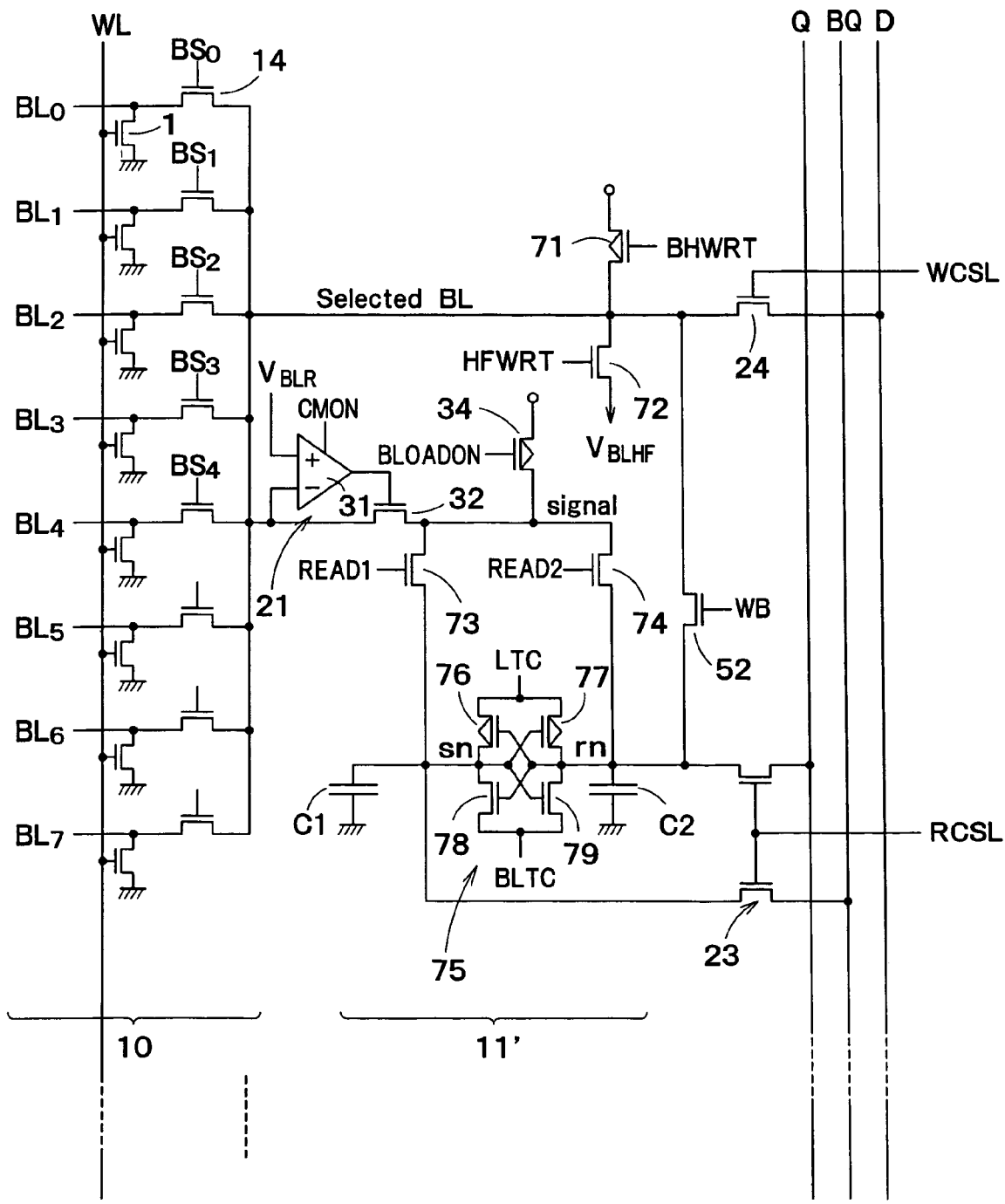
FIG. 15 is a circuit diagram of the sense amplifier block 11 in the fourth embodiment.

FIG. 15 is a circuit diagram of the sense amplifier block 11 in the fourth embodiment. A circuit shown in FIG. 15 includes a level limiter 21 for fixing the level of the bit line BL to $V_{BLR}$ (for example, 0.2 V) at the time of data reading, a sense amplifier 11', a p-FET 71 for setting a selected bit line to the "1" potential, an n-FET 72 for setting a selected bit line to the "1/2" potential, a read control circuit 23, a write control circuit 24, and a write back control circuit 52.

The sense amplifier 11' includes a p-FET 34 for conducting switching control to determine whether to set an output line "signal" of the level limiter 21 to the high level, an n-FET 73 for performing control to read data from the FBC that has passed through the p-FET 34, a capacitor C1 for holding the data from the FBC, an n-FET 74 for performing control to read "1/2" data serving as a reference, a capacitor C2 for holding "1/2" data that has passed through the n-FET 74, and a flip-flop 75 for amplifying a potential difference between capacitors C1 and C2.

The flip-flop 75 includes cross-coupled p-FETs 76 and 77 and n-FETs 78 and 79. A node sn is connected to gates of the p-FET 77 and the n-FET 79. A node rn is connected to gates of the p-FET 76 and the n-FET 78. Sources of the p-FETs 76 and 77 are supplied with a signal LTC. Sources of the n-FETs 78 and 79 are supplied with a signal BLTC.

Figure 16:
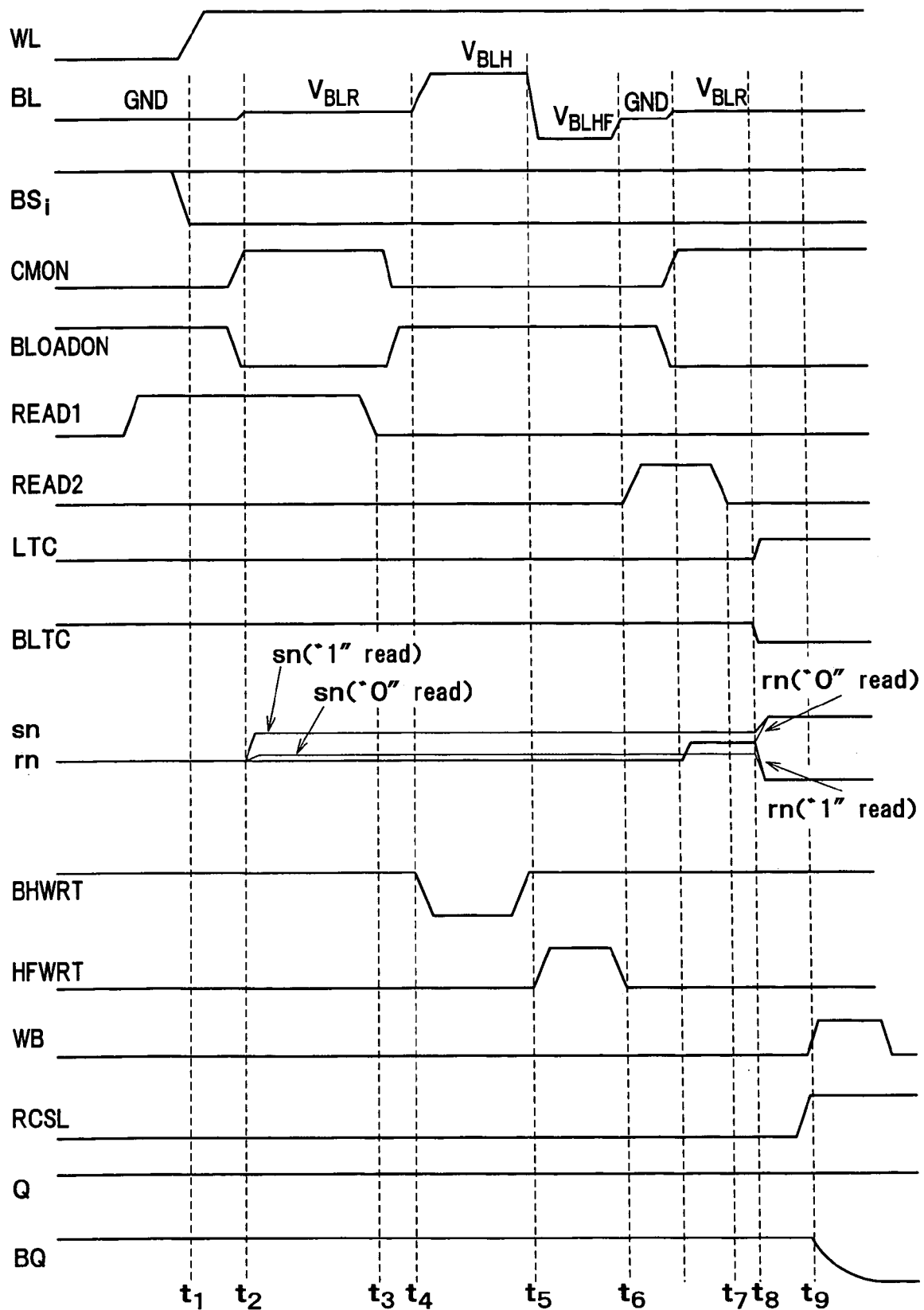
FIG. 16 is an operation timing diagram of the circuit shown in FIG. 15.

FIG. 16 is an operation timing diagram of the circuit shown in FIG. 15. Hereafter, operation of the circuit shown in FIG. 15 will be described with reference to the operation timing diagram shown in FIG. 16. First, at time $t_1$, a word line becomes the high level and one of bit line selection signals $BS_0$ to $BS_7$ becomes the high level. As a result, a bit line is selected. Thereafter, at time $t_2$, a signal CMON becomes the high level and a signal BLOADON becomes the low level. As a result, a cell current flows through an FBC on the selected bit line. Since at this time a signal READ1 is at the high level, a voltage that has appeared at the node "signal" is transmitted to the latch node sn of the flip-flop 75. Thereafter, the signal READ1 becomes the low level at time $t_3$, and the voltage at the latch node sn is held by the capacitor.

At time $t_4$, a signal BHWRT becomes the low level and the selected bit line assumes the power supply voltage. "1" data is written into the selected FBC. The reason why "1" data is necessarily written is as follows: if data that has been originally written into the selected FBC is "0" data, "1/2" data cannot be written unless "1" data is written once.

Thereafter, at time $t_5$, a signal HFWRT becomes the high level and the selected bit line becomes the intermediate potential $V_{BLHF}$. As a result, "1/2" data is written into the selected FBC.

Thereafter, at time $t_6$, a signal READ2 becomes the high level and the intermediate potential which has appeared at the node "signal" is transmitted to the end rn of the flip-flop 75. Thereafter, at time $t_7$, a signal READ2 becomes the low level and the voltage at the latch node rn is held by the capacitor.

Thereafter, at time $t_8$, a potential difference between the latch nodes sn and rn is amplified and latched by setting one end of the flip-flop 73 to the high level, and the other end thereof to the low level. Thereafter, at time $t_9$, a read column selection line RCSL becomes the low level and the read control circuit 23 turns on. As a result, the latch output of the flip-flop 75 is read out to the outside.

In the above-described operation, the original data is destroyed in order to rewrite the data stored in the selected FBC so as to become the intermediate level. After the above-described operation, therefore, it is necessary to write back the original data. At the time $t_9$, therefore, a signal WB becomes the high level and the write back control circuit 52 turns on. As a result, the latch output of the flip-flop 75 is written into the selected FBC again through the write back control circuit 52 and the selected bit line.

It is necessary to conduct refresh operation on the FBC at predetermined intervals. An operation similar to the above-described operation is conducted except that it is not necessary to turn on the read control transistor at the time of refresh.

Thus, in the fourth embodiment, it is determined whether data stored in an FBC is "1" or "0" by reading data in the selected FBC, holding it across a capacitor, then writing the intermediate potential in the same FBC, holding the potential across a capacitor, and comparing potentials across the capacitors to each other. Even if the reference cells are not provided, therefore, the logic of data can be discriminated accurately. Therefore, the reference cells 13 and the reference bit lines RBL become unnecessary and the circuit size can be reduced.

(Fifth Embodiment)

A fifth embodiment differs from the fourth embodiment in circuit configuration of the sense amplifier. FIG. 17 is a circuit diagram of the sense amplifier block 11 in the fifth embodiment. In FIG. 17, components common to FIG. 15 are denoted by like characters and different points will be mainly described hereafter.

Fundamentally, the circuit shown in FIG. 17 is the same as the circuit shown in FIG. 15 except the circuit configuration of the sense amplifier. The sense amplifier shown in FIG. 17 includes a p-FET 34 connected between an output line "signal" and a power supply terminal of a level limiter 21, an n-FET 73, a capacitor C, an inverter 81 and a latch circuit 82 connected in cascade between the output line "signal" and a read control circuit 23, and an n-FET 83 for switching to determine whether to short-circuit between input and output terminals of the inverter 81.

FIG. 18 is an operation diagram for the circuit shown in FIG. 17. Hereafter, operation of the circuit shown in FIG. 17 will be described with reference to the operation timing diagram shown in FIG. 18. First, at time $t_1$, a word line becomes the high level and one of bit line selection signals $BS_0$ to $BS_7$ becomes the high level. As a result, a bit line is selected. Thereafter, at time $t_2$, a signal CMON becomes the high level and a signal BLOADON becomes the low level. As a result, a cell current flows through an FBC on the selected bit line. Since at this time a signal READ is at the high level, a voltage that has appeared at the node "signal" is transmitted to an end of a capacitor C. Furthermore, since a signal SHORT is at the high level, an input of the inverter 81 is short-circuited to an output thereof. Therefore, an input terminal "in" of the inverter 81 is set to a predetermined intermediate potential.

Therefore, a potential difference between a potential that appears on the signal "signal" and depends on data in the selected FBC and an intermediate potential determined by the characteristics of the inverter 81 is applied to the capacitor C. In other words, electric charge equivalent in value of the product of the potential difference and the capacitance C is stored across the capacitor C.

Thereafter, at time $t_3$, the signal READ becomes the low level and the capacitor C holds the stored electric charge. Subsequently, at time $t_4$, a signal BHWRT becomes the low level and "1" data is written into the selected FBC.

Thereafter, at time $t_5$, a signal HFWRT becomes the high level and the selected bit line becomes the intermediate potential $V_{BLHF}$. As a result, "1/2" data is written into the selected FBC.

Thereafter, in a stage (at time $t_7$) in which a potential in the selected FBC based on the intermediate potential has appeared sufficiently in the signal "signal", the signal READ becomes the high level again and reading is started. At preceding time $t_6$, however, a signal SHORT becomes the low level and the input of the inverter 81 is disconnected from the output thereof. If the potential on the signal "signal" is transmitted to one end "cap" of the capacitor C, therefore, the input terminal of the inverter 81 is subjected to a great potential change by capacitive coupling of the capacitor C.

Until the time $t_6$, the input terminal of the inverter 81 is short-circuited to the output terminal thereof and the inverter 81 is biased to a point where the amplification gain becomes the highest. Therefore, a potential change at an input node "in" caused by this capacitive coupling is largely inverted and transmitted to an output "bout". The output of the inverter 81 is latched by a subsequent circuit 82.

Thereafter, at time $t_8$, the latch circuit 82 conducts latch operation. At time $t_9$, the read control circuit 23 and the write control circuit turn on and the original data is written back into the FBC.

Furthermore, operation at the time of refresh is also the same as that in FIG. 15 except that the read control circuit is not turned on.

Thus, in the fifth embodiment, a potential difference between the data in the FBC and the intermediate potential is detected in the capacitor C by switching to determine whether to short-circuit the path between the input terminal and the output terminal of the inverter 81 connected to one end of the capacitor C. Without providing the reference cells 13 and the reference bit lines RBL, and with a circuit configuration simpler than that of the fourth embodiment, therefore, the data logic in the FBC can be discriminated accurately.

(Sixth Embodiment)

In a sixth embodiment, multi-value data is stored in the FBC.

Figure 19:
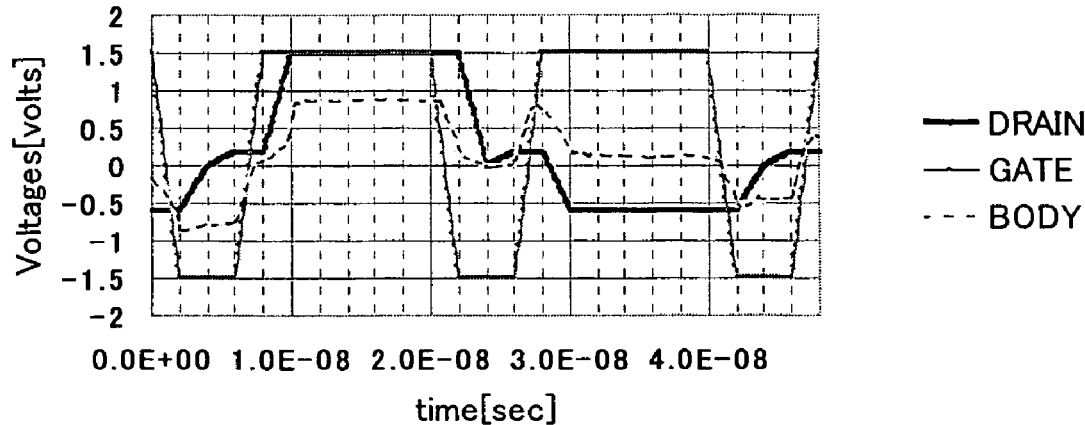
FIG. 19 is a diagram showing simulation results conducted on an FBC having the same structure as that shown in FIG. 2 by starting from the equilibrium state of "0" at 27° C., writing "1" data, reading that data, thereafter setting the bit line potential respectively to −0.58 V, conducting writing, and subsequently reading the data.
Figure 20:
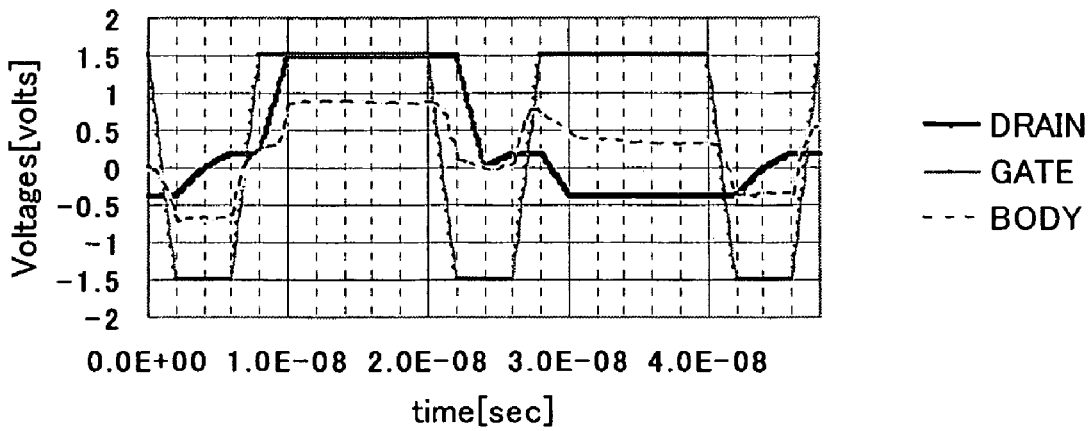
FIG. 20 is a diagram showing simulation results conducted on an FBC having the same structure as that shown in FIG. 2 by starting from the equilibrium state of "0" at 27° C., writing "1" data, reading that data, thereafter setting the bit line potential respectively to −0.36 V, conducting writing, and subsequently reading the data.
Figure 21:
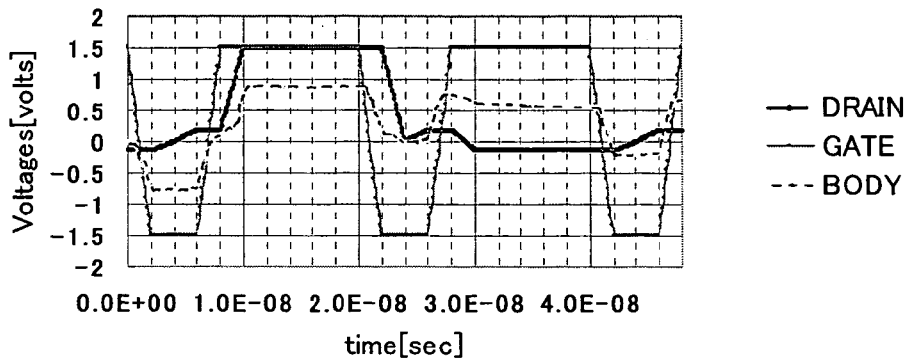
FIG. 21 is a diagram showing simulation results conducted on an FBC having the same structure as that shown in FIG. 2 by starting from the equilibrium state of "0" at 27° C., writing "1" data, reading that data, thereafter setting the bit line potential respectively to −0.14 V, conducting writing, and subsequently reading the data.

FIGS. 19, 20 and 21 are diagrams showing simulation results conducted on an FBC having the same structure as that shown in FIG. 2 by starting from the equilibrium state of "0" at 27° C., writing "1" data, reading that data, thereafter setting the bit line potential respectively to −0.58 V, −0.36 V and −0.14 V, which are smaller in absolute value than the bit line potential (−0.8 V) at the time of "0" writing in FIG. 2, conducting writing, and subsequently reading the data.

Figure 22:
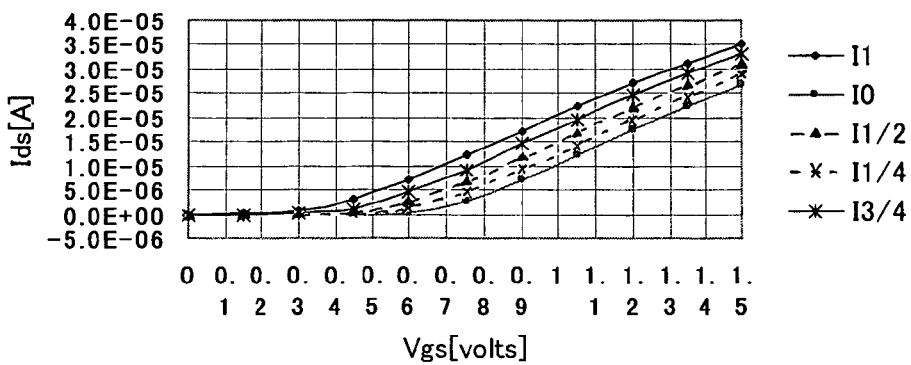
FIG. 22 is a diagram obtained by monitoring currents $I_{1/4}$, $I_{1/2}$ and $I_{3/4}$ at the time of readout in 46 to 48 ns in waveforms shown in FIGS. 19 to 21.

FIG. 22 is a diagram obtained by monitoring currents $I_{1/4}$, $I_{1/2}$ and $I_{3/4}$ at the time of readout in 46 to 48 ns in waveforms shown in FIGS. 19 to 21, and superposing these currents on each other. As appreciated from FIG. 22, there is $I_{1/2}$ nearly in the middle between $I_0$ and $I_1$, there is $I_{1/4}$ nearly in the middle between $I_0$ and $I_{1/2}$, and there is $I_{3/4}$ nearly in the middle between $I_1$ and $I_{1/2}$.

"1" writing is conducted and a large number of holes are stored in the floating channel body. From this state, a bit line is set to a negative level and the pn junction between the channel body and the drain is biased in the forward direction. At this time, the number of holes emitted in a short time of several ns differs according to the value of the bit line potential. As a result, the number of holes remaining in the channel body differs. Therefore, working of the body effect changes. Accordingly, various current states can be implemented between the current $I_0$ of "0" data and the current $I_1$ of "1" data. It is considered that FIG. 22 means such a mechanism.

The present embodiment has a feature that multi-value data is stored in the FBC by holding the intermediate level other than "1" and "0" in the FBC with due regard to the characteristics shown in FIGS. 19 to 22. When holding the intermediate level in the FBC, "1" writing is conducted and then a desired intermediate potential is written.

Figure 23:
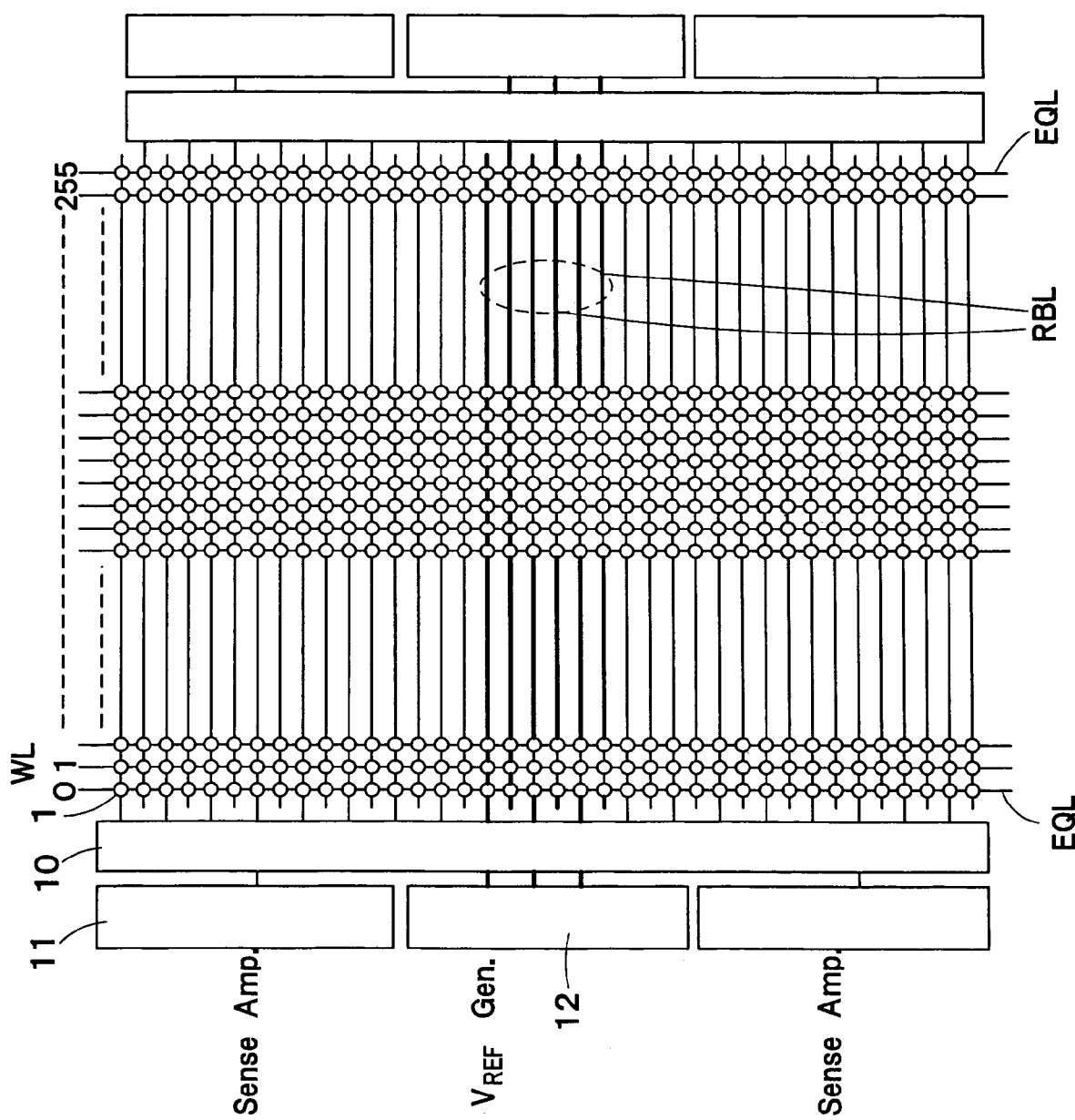
FIG. 23 is a block diagram showing a schematic configuration of a sixth embodiment of a semiconductor integrated circuit device according to the present invention.

FIG. 23 is a block diagram showing a schematic configuration of a sixth embodiment of a semiconductor integrated circuit device according to the present invention. FIG. 23 shows a diagram obtained by picking out 256 word lines WL and 32 bit lines BL. The semiconductor integrated circuit device shown in FIG. 23 has a feature that it has three reference bit lines $RBL_{1/2}$, $RBL_{1/4}$ and $RBL_{3/4}$ and reference cells 13 connected to the respective reference bit lines.

Figure 24:
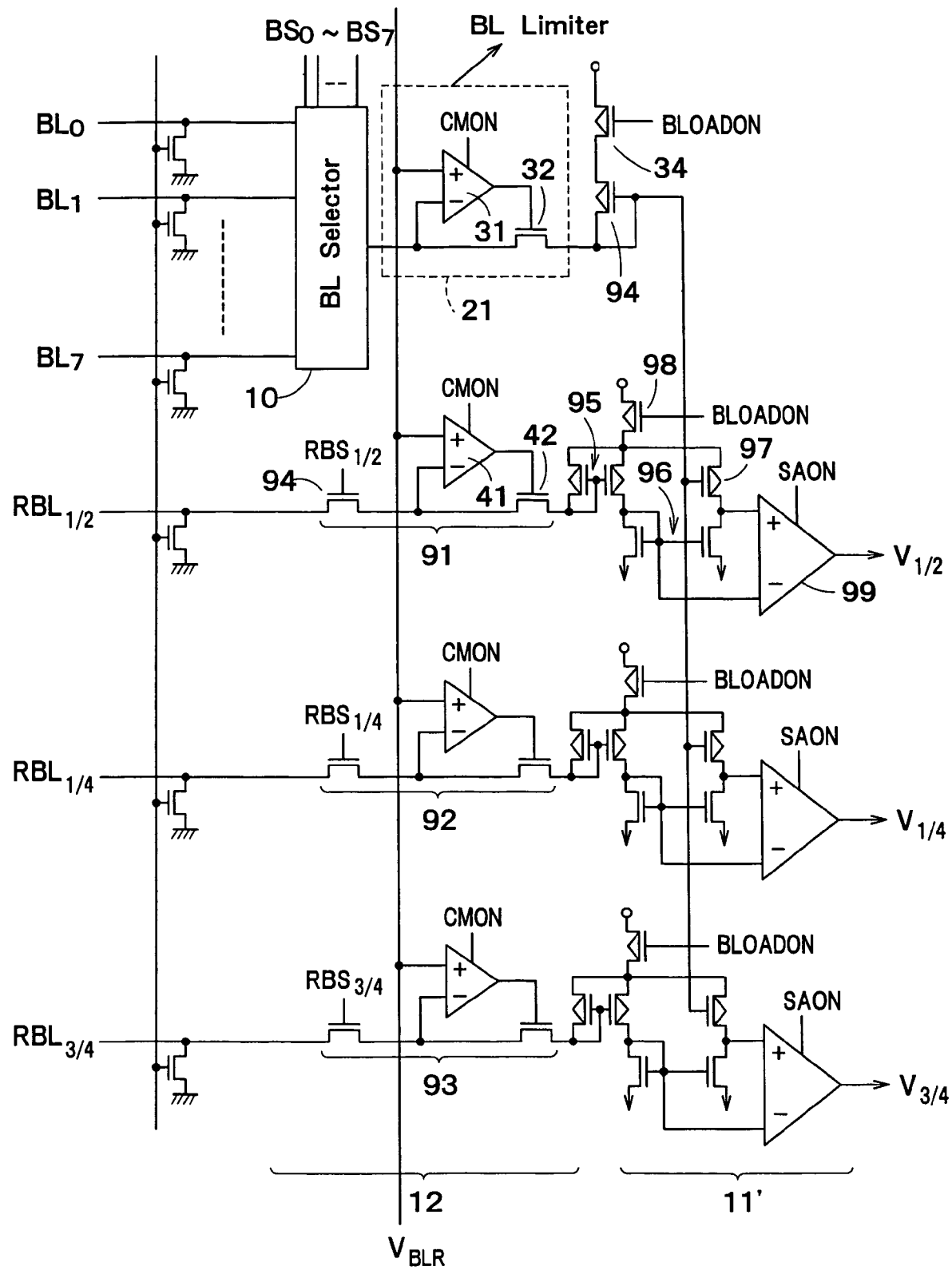
FIG. 24 is a circuit diagram of a sense amplifier block 11' in the sixth embodiment.

FIG. 24 is a circuit diagram of a sense amplifier block 11' in the sixth embodiment. The circuit shown in FIG. 24 includes a bit line selector circuit 10 having a circuit configuration similar to that shown in FIG. 9, a level limiter 21, a sense amplifier 11', and a reference potential generator circuit 12.

The reference potential generator circuit 12 includes a reference potential generator 91 for generating a reference potential $V_{1/2}$, a reference potential generator 92 for generating a reference potential $V_{1/4}$, and a reference potential generator 93 for generating a reference potential $V_{3/4}$.

These three reference potential generators 91 to 93 have the same circuit configuration, and include a reference bit line selection transistor 94, and a level limiter composed of an operation amplifier 41 and an n-FET 42.

"1/2" data, "1/4" data and "3/4" data are previously written into reference cells 13 respectively connected to reference bit lines $RBL_{1/2}$, $RBL_{1/4}$ and $RBL_{3/4}$ corresponding to the reference potential generators 91 to 93.

The sense amplifier 11' includes a current load circuit composed of p-FETs 34 and 98, a current mirror circuit 95 composed of p-FETs, a current mirror circuit 96 composed of n-FETs, a p-FET 94, a p-FET 97 forming a current mirror circuit in conjunction with the p-FET 94, a p-FET 98 forming a current source, and an operational amplifier 99.

The current mirror circuits 95 and 96 have a mirror ratio of 1:1. The current mirror circuit formed of the p-FETs 94 and 97 also has a mirror ratio of 1:1.

A (+) input terminal of the operational amplifier 99 is connected to a drain of the p-FET 97. A (−) input terminal of the operational amplifier 99 is connected to a node between the current mirror circuits 95 and 96.

Hereafter, operation of the circuit shown in FIG. 24 will be described. When a word line rises and the bit line selector circuit 10 has selected one bit line, all reference bit lines $RBL_{1/2}$, $RBL_{1/4}$ and $RBL_{3/4}$ are selected. If a signal CMON becomes the high level and a signal BLOADON becomes the low level, a current flows from a high voltage power supply toward the FBC or three reference cells 13 via the p-FET 34 and the p-FET 98.

The bit line voltage and the voltage of the three reference bit lines RBL are limited to $V_{BLR}$ (for example, 0.2V) by the operation of the level limiter 21. If the data in the FBC is "1", $I_1$ flows to the bit line. If the data in the FBC is "0", $I_0$ flows to the bit line.

Into some FBCs, "5/8", which is an intermediate value between "1/2" and "3/4", and "3/8", which is an intermediate value between "1/2" and "1/4", are beforehand written, and $I_{5/8}$ and $I_{3/8}$ flow. The current flowing through the reference bit line $RBL_{1/2}$ is $I_{1/2}$. The current flowing through the reference bit line $RBL_{1/4}$ is $I_{1/4}$. The current flowing through the reference bit line $RBL_{3/4}$ is $I_{3/4}$. In this way, any of four values "0", "3/8", "5/8", and "1" is written into a FBC. Any of "1/4", "1/2" and "3/4" is written into a reference cell 13.

When a signal SAON becomes the high level, the operational amplifier (differential amplifier) 99 is activated. A cell current flowing through the p-FET 97 supplied with a voltage $V_{sn}$ at its gate and the reference cell currents of three kinds flowing through the respective reference bit lines RBL are compared and amplified by the operational amplifiers 99.

More specifically, the first operational amplifier 99 outputs a voltage $V_{1/2}$, which indicates a result of comparison between the cell current and $I_{1/2}$. The second operational amplifier 99 outputs a voltage $V_{1/4}$, which indicates a result of comparison between the cell current and $I_{1/4}$. The third operational amplifier 99 outputs a voltage $V_{3/4}$, which indicates a result of comparison between the cell current and $I_{3/4}$.

A relationship between a comparison result in magnitude and two-bit data stored in the FBC are shown in FIG. 25. If "00" is stored in the FBC, then the cell current $I_{cell}=I_0$, and all outputs $V_{1/4}$, $V_{1/2}$ and $V_{3/4}$ of the operational amplifiers 99 become the high level. If "01" is stored in the FBC, then the cell current $I_{cell}=I_{3/8}$, and only the output $V_{1/4}$ of the operational amplifier 99 becomes the low level. If "10" is stored in the FBC, then the cell current $I_{cell}=I_{5/8}$, and only the output $V_{3/4}$ of the operational amplifier 99 becomes the high level. If "11" is stored in the FBC, then the cell current $I_{cell}=I_1$, and all outputs of the operational amplifiers 99 become the low level.

Thus, in the sixth embodiment, multi-value data is stored in the FBC. The logic of data is determined by a difference in current between the multi-value data and reference cells 13 to which intermediate potentials have been beforehand set. Without increasing the number of cells, therefore, the storage capacity can be increased.

What is claimed is:

1. A semiconductor integrated circuit device, comprising:
   a semiconductor layer formed via an embedded insulation film on a substrate;
   an FBC (Floating Body Cell) which stores data by accumulating a majority carrier in a floating channel body formed on said semiconductor layer; and
   a sense amplifier which performs control for reading out data stored in said FBC,
   wherein said sense amplifier includes:
      a hold circuit which holds by reading out data stored in a selected FBC;
      a writing control circuit which performs control for reading out data stored in the selected FBC, writing data "1" with a larger number of holes into the selected FBC, and writing intermediate data whose body potential is less than data "1" and more than data "0" with a smaller number of holes into the selected FBC; and
      a comparison circuit which reads out the intermediate data stored in the selected FBC, and compares the read-out data with data held by said hold circuit.

2. The semiconductor integrated circuit device according to claim 1, wherein said hold circuit includes:
  a first capacitor which holds by reading out data stored in the selected FBC at first time; and
  a second capacitor which holds by reading out the intermediate data stored in the selected FBC at second time,
  wherein said comparison circuit has a circuit which amplifies and latches a potential difference of said first and second capacitors.

3. The semiconductor integrated circuit device according to claim 2, further comprising a write-back control circuit which performs control for writing back a latched output of said latch circuit to the selected FBC.

4. The semiconductor integrated circuit device according to claim 1, further comprising a capacitor which holds data read out from the selected FBC,
  wherein the comparison circuit includes:
    a logic inverting circuit connected to one end of said capacitor; and
    a latch circuit which latches an output of said logic inverting circuit,
    wherein said writing control circuit which holds data read out from the selected FBC in said capacitor at a state of shortcutting a path between an input terminal and an output terminal of said logic inverting circuit, writes data "1" to the FBC, writes intermediate data less than data "1" and more than data "0" to the FBC, and inputs data read out from the FBC to one end of said capacitor at a state of cutting off the path between the input terminal and the output terminal of said logic inverting circuit.

5. The semiconductor integrated circuit device according to claim 1, further comprising:
  a bit line selection circuit which selects one FBC among a plurality of FBCs each being connected to a bit line different from each other and being connected to the same word line; and
  a potential limiter which fixes a potential of the bit line selected by said bit line selection circuit to a prescribed potential.

6. The semiconductor integrated circuit device according to claim 5, further comprising:
  a high level setting circuit which sets a potential of an output line of said bit line selection circuit to data "1"; and
  an intermediate level setting circuit which sets a potential of the output line of said bit line selection circuit to said intermediate data.

* * * * *